(12) United States Patent
Otsubo

(10) Patent No.: US 7,370,297 B2
(45) Date of Patent: May 6, 2008

(54) METHOD, SYSTEM, AND COMPUTER PROGRAM FOR VALIDATING CORRESPONDENCE INFORMATION BETWEEN BEHAVIOR AND LOWER LEVEL DESCRIPTION OF A CIRCUIT DESIGN

(75) Inventor: Motohide Otsubo, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 359 days.

(21) Appl. No.: 11/065,535

(22) Filed: Feb. 25, 2005

(65) Prior Publication Data

US 2005/0193360 A1 Sep. 1, 2005

(30) Foreign Application Priority Data

Feb. 27, 2004 (JP) ............................ 2004-053481

(51) Int. Cl.
*G06F 17/50* (2006.01)
(52) U.S. Cl. ....................... 716/3; 716/4; 716/5; 716/18
(58) Field of Classification Search ................ 716/3–5, 716/18
See application file for complete search history.

(56) References Cited

U.S. PATENT DOCUMENTS

| 5,727,187 | A | * | 3/1998 | Lemche et al. ............... 716/18 |
| 5,867,395 | A | * | 2/1999 | Watkins et al. ............... 716/18 |
| 5,937,190 | A | | 8/1999 | Gregory et al. |
| 5,940,779 | A | * | 8/1999 | Gaitonde et al. ............. 702/60 |
| 7,137,078 | B2 | * | 11/2006 | Singhal et al. .................. 716/1 |
| 2003/0182638 | A1 | * | 9/2003 | Gupta et al. ..................... 716/4 |
| 2004/0177334 | A1 | * | 9/2004 | Horan et al. ................... 716/18 |

FOREIGN PATENT DOCUMENTS

| EP | 0 847 022 A2 | 6/1998 |
| JP | 05-242183 | 9/1993 |

OTHER PUBLICATIONS

DeMicheli, Giovani, "Synthesis and Optimization of Digital Circuits," Mc-Graw Hill, Inc.; 1994, pp. 141-266.
R. L. Blackburn et al., "CORAL II: Linking Behavior and Structure in an IC Design System," Proceedings of the Design Automation Conference, Jun. 12-15, 1988, IEEE, vol. Conf. 25, 1998, XP010013022; pp. 529-534.

* cited by examiner

*Primary Examiner*—Jack Chiang
*Assistant Examiner*—Nghia M. Doan
(74) *Attorney, Agent, or Firm*—Foley & Lardner LLP

(57) ABSTRACT

A circuit design support method, system, and computer program product for displaying information on a circuit information described according to each design level in circuit design is described. The method and system includes acquiring behavior level description information by description of a behavior level. They also include acquiring lower level description information in a design level lower than the behavior level. Further, acquiring correspondence information for making correspondence between part of the behavior level description information and part of the lower level description information is included, along with displaying correspondence between part of the behavior level description information and part of the lower level description information based on the correspondence information. Displaying the correspondence can further include receiving a user selection of a part of the correspondence information, and highlighting the user selection of both the behavior level description information and the lower level description information from the correspondence information.

18 Claims, 25 Drawing Sheets

| FILE NAME | LINE NUMBER | CORRESPONDING FILE NAME | CORRESPONDING LINE NUMBER |
|---|---|---|---|
| main.c | 44 | main.v | 104 |
| | | main.v | 114 |
| | 46 | main.v | 105 |
| | | | |
| main.v | 104 | main.c | 44 |
| | 105 | main.c | 46 |
| | | main.c | 49 |
| | | | |

FIG. 3

```
Find  Reload main.c sub2.c sub3.c
00040  r1 = i2;
00041
00042  if ( x == 0 ) {
00043    tmp = i;
00044    tmp2 = i + r2;
00045  }
00046  i = tmp2 + 1;
00047
00048
00049  for ( j = n; j < m; j++ ) {
00050    a[j] = h;
00051    for ( k = 0; k < 8; k++ ) {
00052      b[k] = g + tmp;
00053      c[k+j] = b[j];
00054    }
00055
00056  }
00057  }
00058
00059  int func( short x, short y )
00060  {
```

```
main.v
00100  assign x = tmp1 ;
00101  assign y = tmp2;
00102  assign z = RG_28;
00103
00104  add32_41 INST_5 (.in1(in1), .in2(i
00105  add32_42 INST4 (.in1(in3), .in(in4)
00106
00107  endmodule
00108
00109  module add32_41 (in1, in2, out1);
00110    input [31:0] in1 ;
00111    input [31:0] in2 ;
00112    output [31:0] out1 ;
00113
00114    assign out1 = in1 + in2;
00115
00116  endmodule
00117
00118
00119
00120
```

300, 301, 302, 303 (Reload), 304 (Find)

INTRA-RTL CORRESPONDENCE INFORMATION 124

| FILE NAME OF RTL DESCRIPTION | INSTANCE NAME OF COMPONENT IN RTL DESCRIPTION | LINE NUMBER OF RTL DESCRIPTION |
|---|---|---|
| main.v | RG_28 | 102, 54 |
| | INST_5 | 104 |
| | INST_4 | 105 |

FIG. 9A

GATE-RTL CORRESPONDENCE INFORMATION 125

| PATH NAME | INSTANCE NAME OF GATE IN DELAY REPORT | FILE NAME OF RTL DESCRIPTION | INSTANCE NAME OF COMPONENT IN RTL DESCRIPTION | BIT POSITION OF COMPONENT IN RTL DESCRIPTION |
|---|---|---|---|---|
| path1, path2 | RG_28_reg1 | main.v | RG_28 | 1 |
| path1 | INST_4 | main.v | INST_4 | |
| path1, path3 | INST_5 | main.v | INST_5 | |

FIG. 9B

```
------------------------------- path1 -------------------------------
Point                                                    Incr    Path clock CLOCK (rise edge)                                  0.00    0.00
clock network delay (ideal)                              0.00    0.00
INST_2$RG_28_reg1$H02 (TBDFHAX1)                         0.00    0.00 r
INST_2$RG_28_reg1$N01 (TBDFHAX1)                         0.28    0.28 r
INST_2$INST_5$in21 (add32_41)                            0.00    0.28 r
INST_2$INST_5$add_2353$B1 (add32_41_DW01_add_33_0)       0.00    0.28 r
INST_2$INST_5$add_2353$U1_1$N02 (TBADFAX1)               0.40    0.68 r
INST_2$INST_5$add_2353$U1_31$N01 (TBADFAX1)              1.10    1.78 r
INST_2$INST_5$add_2353$SUM31 (add32_41_DW01_add_33_0)    0.00    1.78 r
INST_2$INST_5$out11 (add32_41)                           0.00    1.78 r
INST_2$INST_4$in11 (add32_42)                            0.00    1.78 r
INST_2$INST_4$add_2344$A1 (add32_42_DW01_add_33_0)       0.00    1.78 r
INST_2$INST_4$add_2344$U1_1$N02 (TBADFAX1)               0.32    2.10 r
INST_2$INST_4$add_2344$U1_2$N01 (TBADFAX1)               0.18    2.28 f
INST_2$INST_4$add_2344$SUM2 (add32_42_DW01_add_33_0)     0.00    2.28 f
INST_2$INST_4$out22 (add32_42)                           0.00    2.28 f
INST_2$U18008$N01 (TBXN2X1)                              0.10    2.38 r
INST_2$U16304$N01 (TBINVX1)                              0.05    2.43 f
INST_2$U17504$N01 (TBND3BBX1)                            0.10    2.53 f
INST_2$RG_28_reg31$H01 (TBDFHAX1)                        0.00    2.53 f
data arrival time                                                2.53 clock CLOCK (rise edge)                                  2.53    2.53
clock network delay (ideal)                              0.00    2.53
INST_2$RG_28_reg31$H02 (TBDFHAX1)                        0.00    2.53 r
library setup time                                      -0.10    4.90
data required time                                               4.90 data required time                                               4.90
data arrival time                                               -2.53 slack (MET)                                                      2.37
```

FIG. 10A

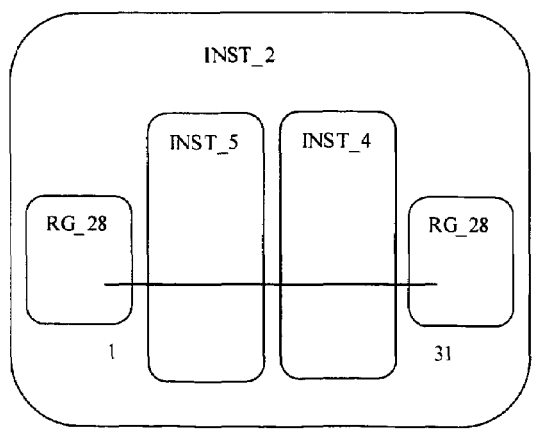

FIG. 10B

```
----------------------------- path1 -----------------------------

Point                                                            Incr    Path
-----------------------------------------------------------------------------
clock CLOCK (rise edge)                                          0.00    0.00
clock network delay (ideal)                                      0.00    0.00
TOP/INST_2$RG_28_reg1$H02 (TBDFHAX1)                             0.00    0.00 r
TOP/INST_2$RG_28_reg1$N01 (TBDFHAX1)                             0.28    0.28 r
TOP/INST_2$INST_5$in21 (add32_41)                                0.00    0.28 r
TOP/INST_2$INST_5$add_2353$B1 (add32_41_DW01_add_33_0)           0.00    0.28 r
TOP/INST_2$INST_5$add_2353$U1_1$N02 (TBADFAX1)                   0.40    0.68 r
TOP/INST_2$INST_5$add_2353$U1_31$N01 (TBADFAX1)                  1.10    1.78 r
TOP/INST_2$INST_5$add_2353$SUM31 (add32_41_DW01_add_33_0)        0.00    1.78 r
TOP/INST_2$INST_5$out11 (add32_41)                               0.00    1.78 r
TOP/INST_2$INST_4$in11 (add32_42)                                0.00    1.78 r
TOP/INST_2$INST_4$add_2344$A1 (add32_42_DW01_add_33_0)           0.00    1.78 r
TOP/INST_2$INST_4$add_2344$U1_1$N02 (TBADFAX1)                   0.32    2.10 r
TOP/INST_2$INST_4$add_2344$U1_2$N01 (TBADFAX1)                   0.18    2.28 f
TOP/INST_2$INST_4$add_2344$SUM2 (add32_42_DW01_add_33_0)         0.00    2.28 f
TOP/INST_2$INST_4$out22 (add32_42)                               0.00    2.28 f
TOP/INST_2$U18008$N01 (TBXN2X1)                                  0.10    2.38 r
TOP/INST_2$U16304$N01 (TBINVX1)                                  0.05    2.43 f
TOP/INST_2$U17504$N01 (TBND3BBX1)                                0.10    2.53 f
TOP/INST_2$RG_28_reg31$H01 (TBDFHAX1)                            0.00    2.53 f
data arrival time                                                        2.53 clock CLOCK (rise edge)                                          2.53    2.53
clock network delay (ideal)                                      0.00    2.53
TOP/INST_2$RG_28_reg31$H02 (TBDFHAX1)                            0.00    2.53 r
library setup time                                              -0.10    4.90
data required time                                                       4.90
-----------------------------------------------------------------------------
data required time                                                       4.90
data arrival time                                                       -2.53
-----------------------------------------------------------------------------
slack (MET)                                                              2.37
```

FIG. 11A

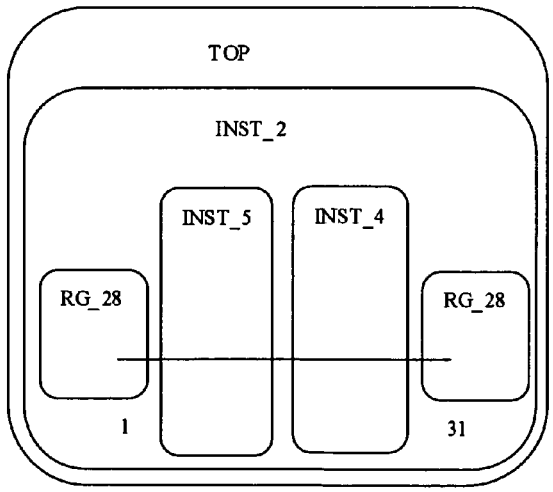

FIG. 11B

BEHAVIOR LEVEL-RTL CORRESPONDENCE INFORMATION 127

| FILE NAME OF RTL DESCRIPTION | INSTANCE NAME OF COMPONENT IN RTL DESCRIPTION | FILE NAME OF BEHAVIOR LEVEL DESCRIPTION | LINE NUMBER OF BEHAVIOR LEVEL DESCRIPTION |
|---|---|---|---|
| main.v | RG_28 | main.c | 10, 85 |
| | INST_5 | | 44 |
| | INST_4 | | 46 |
| | | | |

FIG. 16A

GATE-BEHAVIOR LEVEL CORRESPONDENCE INFORMATION 128

| PATH NAME | INSTANCE NAME OF GATE IN DELAY REPORT | FILE NAME OF BEHAVIOR LEVEL DESCRIPTION | LINE NUMBER OF BEHAVIOR LEVEL DESCRIPTION |
|---|---|---|---|
| path1, path2 | RG_28_reg1 | main.c | 10, 85 |
| path1 | INST_4 | main.c | 46 |
| path1, path3 | INST_5 | main.c | 44 |
| | | | |

FIG. 16B

DELAY REPORT ANALYSIS INFORMATION 129

| BUS EXPANSION RULE | %s%d |
|---|---|
| HIERARCHY SEPARATION RULE | /、$ |
| INSTANCE NAME RENAMING RULE | _reg |
| TARGET HIERARCHY RULE | level2 |
| | |

FIG. 19

METHOD, SYSTEM, AND COMPUTER PROGRAM FOR VALIDATING CORRESPONDENCE INFORMATION BETWEEN BEHAVIOR AND LOWER LEVEL DESCRIPTION OF A CIRCUIT DESIGN

BACKGROUND OF THE INVENTION

1. Field of the Invention

The present invention relates to a circuit design support system, and more particularly to a circuit design support system for displaying the circuit information described by the description of each design level.

2. Description of the Related Art

Semiconductor circuits, such as LSIs, are manufactured in fabrication steps, after a series of design steps which include system design, function design, logic design and layout design. In this series of design steps, various design support systems and programs are used to support the design of large scale integrated circuits.

In each design step, an optimum description method is taken to clarify the content of a configuration. For example, in the function design, the circuit information described by behavior level description and the function level description are used for designing, and in logic design, the circuit information described by gate level description and the transistor level description are used.

Recently to improve design efficiency, a method that converts the behavior level description of C language into an RTL description by behavioral synthesis is attracting attention. Behavioral synthesis is disclosed, for example, in Giovanni DeMicheli: "Synthesis and Optimization of Digital Circuits," McGraw-Hill, Inc., 1994, pp. 141-266.

In logical synthesis, delay analysis is performed by simulating the behavior of each gate, and the delay time for each path, of which the start point is the input terminal or storage element and the end point is the output terminal or storage element, is output as a delay report. If this delay time exceeds the design reference value, this is a delay rule violation, so the designer must correct the RTL description. However the problem here is that it is difficult to identify the RTL description, corresponding to a path or gate, which is in violation of the rule, from the delay report. Therefore in Japanese Unexamined Patent Application Publication No. 5-242183, a method for corresponding the delay report and the RTL description is disclosed.

FIG. 25 shows an example of the configuration of a conventional circuit design support system. This conventional circuit design support system 2500 comprises a control unit 2510, storage unit 2520, display unit 2530 and input unit 2540. The control unit 2510 further comprises logical synthesis processing 2511, delay analysis processing 2512 and correspondence display processing 2513, and the storage unit 2520 further comprises RTL description information 2521, route information 2522, logical circuit information 2523, delay report information 2524 and correspondence information 2525.

For example, the RTL description information 2521, which is the circuit information of the RTL description, is input by the designer via the input unit 2540, and is stored in the storage unit 2520. The route information 2522, which is information on the start point and the end point of the route of the path when the delay is analyzed, is input and stored in the storage unit 2520 by the designer.

The logical synthesis processing 2511 generates logical circuit information 2523, which is the circuit information of the gate level description of the route, based on the RTL description information 2521 and the route information 2522, and stores it in the storage unit 2520. The logical synthesis processing 2511 also creates the correspondence information 2525, which indicates the correspondence relationship between the RTL description information 2521 and the logical circuit information 2523, and stores it in the storage unit 2520.

The delay analysis processing 2512 analyzes the delay of the logical circuit and creates the delay report information 2524 based on the logical circuit information 2523, and stores it in the storage unit 2520.

The correspondence display processing 2513 displays the RTL description corresponding to the gate which has the delay on the display unit 2530 based on the RTL description information 2521, the delay report information 2524 and the correspondence information 2525. By this, the area to be corrected of the RTL description can be clarified.

However if the RTL description is generated by the behavioral synthesis of the behavior level description using a conventional circuit design support system 2500, and logical synthesis is performed, there is no means of corresponding the behavior level description before behavioral synthesis and the RTL description after behavioral synthesis, so the designer opens each description by an editor and performs confirmation and correction while estimating the correspondence relationship.

In this way, if logical synthesis is performed after behavioral synthesis in the conventional circuit design support system, and if the delay rule violation is detected by the delay analysis, then the behavior level description cannot be displayed, even if the RTL description corresponding to the path where the delay rule violation occurred can be displayed. Therefore the designer is required to perform complicated manual work in order to correspond the RTL description generated by the behavioral synthesis with the behavior level description before behavioral synthesis. Therefore the design operation consumes time, and it is difficult for the user unaccustomed to such work.

Also in the conventional circuit design support system, the designer checks the design while estimating the correspondence relationship between the behavior level description before behavioral synthesis and the RTL description after behavioral synthesis, so the design operation consumes time, and correspondence mistakes occur.

As described above, in the case of the conventional circuit design support system, if the circuit is designed using the circuit information for the behavior level description, the behavior level description and the description of other levels cannot be corresponded, so the design efficiency is poor, which may cause design defects.

SUMMARY OF THE INVENTION

According to one aspect of the present invention, there is provided a computer program product, in a computer readable medium, including computer program instructions thereon which when executed by a computer display information on a circuit information described according to each design level in circuit design, the computer program instructions implementing a method comprising: acquiring behavior level description information in which circuit information is described by description of a behavior level; acquiring lower level description information in which circuit information on a same circuit as the behavior level description information is described in a design level lower than the behavior level; acquiring correspondence information for making correspondence between a part of the behavior level description information and a part of the lower level description information; and displaying the correspondence between the part of the behavior level description information and the part of the lower level description information based on the correspondence information.

According to another aspect of the present invention, there is provided a circuit design support method for displaying information on a circuit information described according to each design level in circuit design, comprising: acquiring behavior level description information in which circuit information is described by description of a behavior level; acquiring lower level description information in which circuit information on a same circuit as the behavior level description information is described in a design level lower than the behavior level; acquiring correspondence information for making correspondence between a part of the behavior level description information and a part of the lower level description information; and displaying the correspondence between the part of the behavior level description information and the part of the lower level description information based on the correspondence information.

According to still another aspect of the present invention, there is provided a circuit design support system for displaying information on a circuit information described according to each design level in circuit design, comprising: a behavior level description information acquisition unit for acquiring behavior level description information in which circuit information is described by description of a behavior level; a lower level description information acquisition unit for acquiring lower level description information in which circuit information on a same circuit as the behavior level description information is described in a design level lower than the behavior level; a correspondence information acquisition unit for acquiring correspondence information for making correspondence between a part of the behavior level description information and a part of the lower level description information; and a display unit for displaying the correspondence between the part of the behavior level description information and the part of the lower level description information based on the correspondence information.

By this, the behavior level description and the lower level description are corresponded and displayed, so the user can easily comprehend this correspondence relationship. Therefore the design operation time (checks and corrections) of the user, for the behavior level description corresponding to the portion of the lower level description, can be decreased, and the design efficiency can be improved. Also the behavior level description and the lower level description are corresponded and displayed, so the user can accurately comprehend this correspondence relationship. As a result, the user need not make correspondence errors, and design defects can be decreased.

BRIEF DESCRIPTION OF THE DRAWINGS

The above and other objects, advantages and features of the present invention will be more apparent from the following description taken in conjunction with the 15 accompanying drawings, in which:

FIG. 3 shows a screen display example according to the present invention;

FIGS. 9A and 9B show the data configuration to be used for the display processing according to the present invention;

FIGS. 10A and 10B are diagrams depicting the screen display example in the display processing according to the present invention;

FIGS. 11A and 11B are diagrams depicting the screen display example in the display processing according to the present invention;

FIGS. 16A and 16B show the data configuration to be used for display processing according to the present invention;

FIG. 19 shows the data configuration to be used for the display processing according to the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

The configuration of the circuit design support system according to First Embodiment of the present invention will be described with reference to the block diagram in FIG. 1. In each drawing below, composing elements with a same reference number refer to the same elements throughout, of which description is omitted unless it is necessary. The circuit design support system according to the present embodiment is a system for executing processing to display with corresponding the behavior level description and the RTL description. This circuit design support system 100 is comprised of computers, such as a personal computer and a server computer. The circuit design support system 100 may be comprised not of a single computer but of a plurality of computers.

Figure 1:
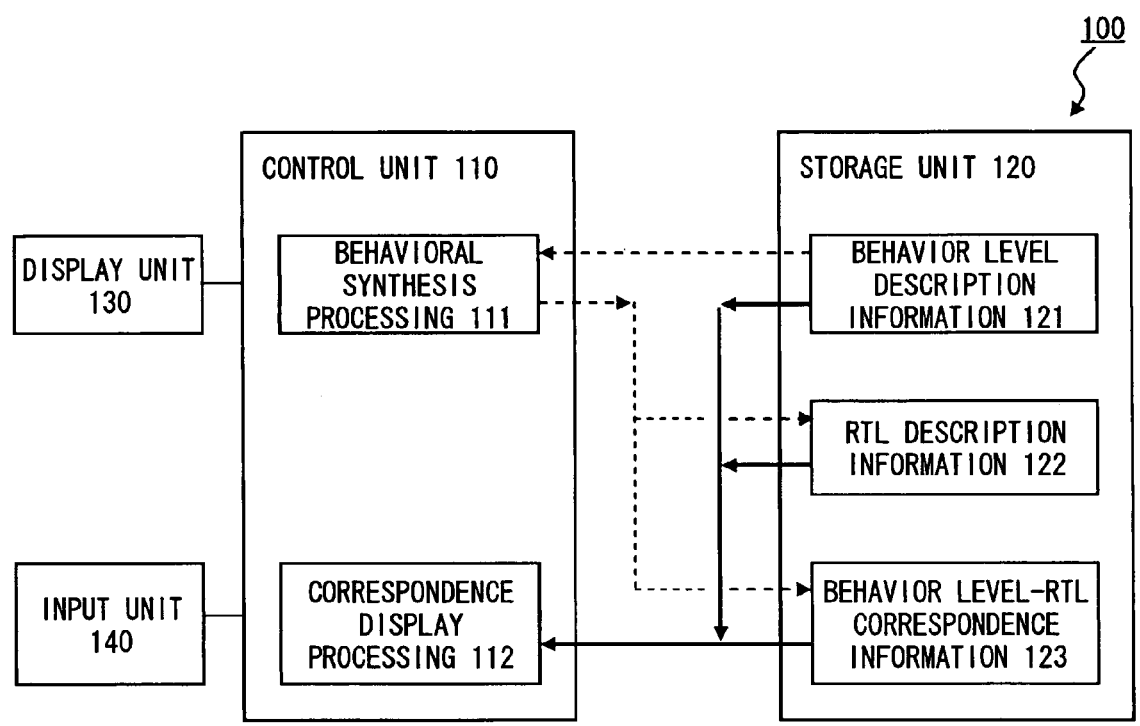
FIG. 1 is a functional diagram depicting the circuit design support system according to the present invention.

As FIG. 1 shows, the circuit design support system 100 comprises a control unit 110, storage unit 120, display unit 130 and input unit 140. The display unit 130 is a display device, such as a monitor. The input unit 140 is an input device, such as a keyboard and mouse.

The control unit 110 is a control processing device, such as a CPU. The control unit 110 executes various processings based on a pre-stored OS program and application programs prestored in the storage unit 120. For example, the programs for the behavioral synthesis processing 111 and the correspondence display processing 112 are stored in the storage unit 120, and the behavioral synthesis processing 111 and the correspondence display processing 112 are executed based on these programs.

The storage unit 120 is comprised of internal storage means, such as a hard disk, and external storage means, such as an optical disk, where the OS program, application programs and various data required for processing each program are stored. In the storage unit 120, behavior level description information 121, RTL description information 122 and behavior level-RTL correspondence information 123 are stored as the various data. Also as application programs, such as programs for the behavioral synthesis processing 111 and the correspondence display processing 112 are stored in the storage unit 120, although these programs are not shown in FIG. 1.

The behavior level description information 121 is the circuit information of the behavior level description. The behavior level description information 121 is input to the input unit 140 by a user, such as a designer, and is stored in the storage unit 120, for example. The behavior level description information 121 is comprised of an arbitrary number of files, and the file format is text, for example. The behavior level description is a description that is a higher level than RTL description, and describes the system behavior. This behavior level description is in C language, for example.

The RTL description information 122 is the circuit information of the RTL description. The RTL description information 122 is generated by the behavioral synthesis processing 111, and is stored in the storage unit 120. The RTL description information 122 is comprised of an arbitrary number of files, and the file format is text, for example. The RTL description describes the connection of combined circuits and registers. The RTL description is described in HDL (Hardware Description Language), such as Verilog-HDL or VHDL, for example. RTL description information 122 is not limited to an RTL description, and may be information on circuits on the design level, which is lower than the behavior level, such as the function level, gate level, transistor level and layout design level.

The behavior level-RTL correspondence information 123 is the correspondence information between the line number of the behavior level description and the line number of the RTL description. The behavior level-RTL correspondence information 123 is generated by the behavioral synthesis processing 111, and is stored in the storage unit 120. The data structure of the behavior level-RTL correspondence information 123 will be described later.

The behavioral synthesis processing 111 is the processing to be executed in the control unit 110. In the behavioral synthesis processing 111, the behavior level description information 121 is input, and by performing the synthesizing operation on this information, the RTL description information 122 is generated and stored in the storage unit 120. The behavioral synthesis processing 111 creates the behavior level-RTL correspondence information 123 during behavioral synthesis, and stores it in the storage unit 120. For example, the behavioral synthesis processing 111 is the processing of the synthesis unit for generating the RTL description information 122 and the behavior level-RTL correspondence information 123 based on the behavior level description information 121. The behavioral synthesis processing 111 may be executed by a system that is different from the circuit design support system 100.

The correspondence display processing 112 is the processing to be executed by the control unit 110. In the correspondence display processing 112, the behavior level description information 121, RTL description information 122 and behavior level-RTL correspondence information 123 are output, and the behavior level description and RTL description are corresponded and displayed on the display unit 130. For example, the correspondence display processing 112 is processing by the behavior level description information acquisition unit for acquiring the behavior level description information 121, the lower level description information acquisition unit for acquiring the RTL description information 122. (lower level description information), the correspondence information acquisition unit for acquiring the behavior level-RTL correspondence information 123, and the display unit for corresponding and displaying the behavior level description information 121 and the RTL description information 122 based on the behavior level-RTL correspondence information 123. The detailed operation of the correspondence display processing 112 will be described later.

Now the data structure of the behavior level-RTL correspondence information 123 will be described with reference to FIG. 2. FIG. 2A shows the data structure of the behavior level-RTL correspondence information 123, and FIG. 2B is an example of data stored as the behavior level-RTL correspondence information 123.

Figures 2A, 2B:
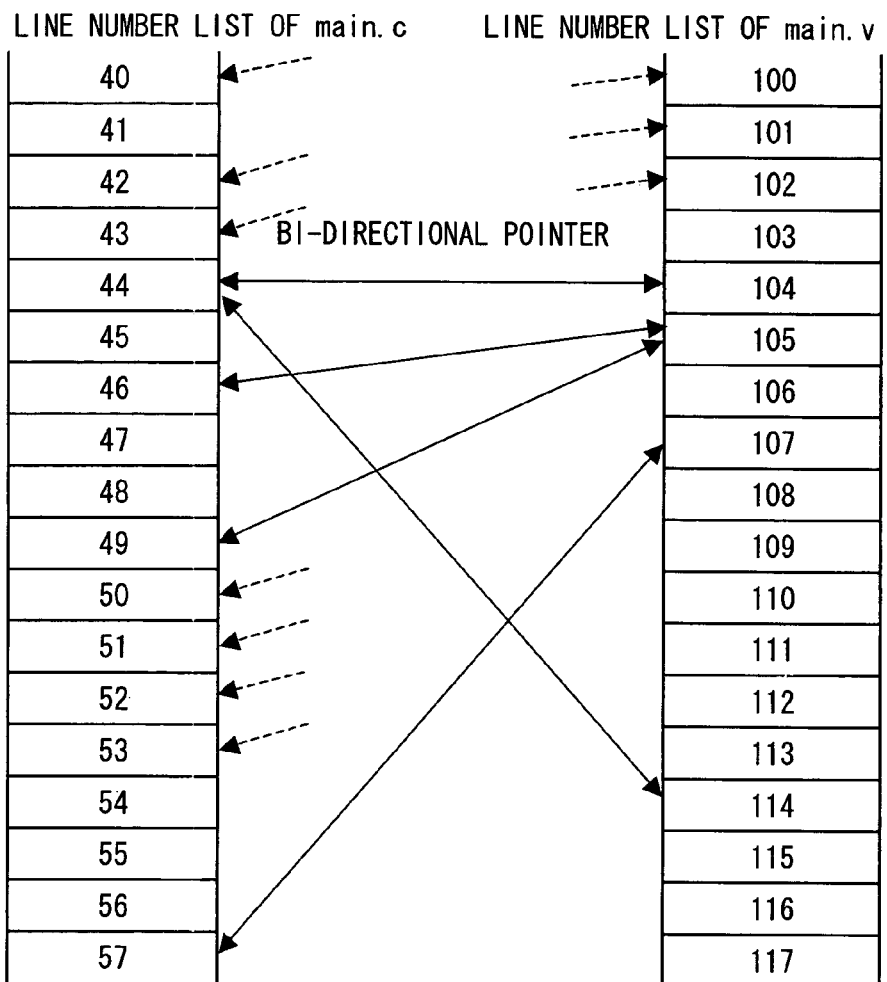
FIGS. 2A and 2B are diagrams depicting the data configuration to be used for the display processing according to the present invention.

In the behavior level-RTL correspondence information 123, as shown in FIG. 2A, the line number of the behavior level description (main.c in the case of this example) and the line number of the RTL description (main.v in the case of this example) are corresponded with each other by bi-directional pointers. One line and one line can be corresponded, or one line and a plurality of lines can be corresponded. In the case of this example, the $44^{th}$ line of main.c is corresponded to the $104^{th}$ line and the $114^{th}$ line of main.v.

In the behavior level-RTL correspondence information 123, the file name and the line number of the corresponding source (behavior level description) and the file name and the line number of the corresponding destination (RTL description) are corresponded respectively, as shown in FIG. 2B.

By using a bi-directional pointer for the behavior level-RTL correspondence information 123, the line number of the reference destination can be easily acquired, whether the reference is from the behavior level description side or from the RTL description side. The present invention is not limited to this example, but other data structures may be used if correspondence of one line and a plurality of lines is possible. The unit of correspondence is not limited to lines, but may be lines and the number of columns, character strings or the position information of a location in the behavior level description information 121 and the RTL description information 122 stored in the storage unit 120 (e.g. address, if the storage unit 120 is a memory, or a physical location on the disk, if the storage unit 120 is a hard disk).

Now an example of the display screen of the correspondence display processing 112 will be described with reference to FIG. 3. This display screen is displayed on the display unit 130 by the correspondence display processing 112. This display screen is an example of a screen where the behavior level description information 121 and the RTL description information 122 are corresponded and displayed.

This display screen 300 is displayed by one window, for example, as FIG. 3 shows. The display screen 300 is comprised of two display areas: a behavior level description display 301 for displaying the behavior level description information 121, and the RTL description display 302 for displaying the RTL description information 122. In FIG. 3, the line numbers and the character strings of each description are displayed in the behavior level description display 301 and the RTL description display 302, but the line numbers need not be displayed.

Also in the behavior level description display 301 and the RTL description display 302 in FIG. 3, each description is displayed as a character string, but one or both of each description may be displayed as a graphic. For example, the behavior level description information 121 may be displayed as a flow chart and the RTL description display 302 may be displayed as a circuit diagram. In this case, in the following display operation, if a part of the graphics or text is clicked on, then the corresponding part of the graphic and text is highlight-displayed. In the case of a graphics display, it is assumed that information the same as the element corresponded by the later mentioned behavior level-RTL correspondence information 123, such as a line number and a character string, are embedded in the graphic. Or it may be assumed that an identifier, which is assigned to each one of the coordinate positions or the graphic and graphic composing elements, is corresponded, instead of a line number, by the later mentioned behavior level-RTL correspondence information 123.

As FIG. 3 shows, at the top of each display screen, a tab 303, to indicate a file name to be displayed, is disposed, and one or a plurality of files can be selected and displayed. Because of this, even if one file and a plurality of files are corresponded or if a plurality of files and a plurality of files are corresponded, the files can be displayed in one window. In the example in FIG. 3, a plurality of files exist only in the area of the behavior level description display 301, but a plurality of files may also exist in the area of the RTL description display 302 in some cases. The plurality of files may be displayed not by tabs but by overlaying a plurality of windows, or a plurality of files may be simultaneously displayed by dividing the area of the behavior level description display 301 or the area of the RTL description display 302.

Here the Find command for searching character strings and the Reload command for reading a file again are disposed as an example of the menu 304. In the menu 304, commands for other processing may be disposed. For example, an edit command may be disposed so that each file can be edited. By this, in the display screen 300, a location causing a delay rule violation can be found and corrected so that efficient design becomes possible.

The behavior level description display 301 and the RTL description display 302 display files corresponded before and after behavioral synthesis. The user can select lines which are corresponded to each other out of the behavior level description display 301 and the RTL description display 302. For example, a line, which has a corresponding destination, is underlined and highlight-displayed in the behavior level description display 301 and the RTL description display 302. This highlight display is not limited to an underline, but may be an arbitrary display method. By highlighting a line which has a corresponding destination, the range of selection can be clearly displayed for a user. A line which has a corresponding destination may be selected without highlighting, but only by selection. Only the corresponding lines out of the file content may be displayed in the behavior level description display 301 and the RTL description display 302, or only the corresponding line numbers may be displayed.

For example, if the user selects a desired line by the mouse of the input unit 140, the selected line is highlight-displayed in bold red, and the line corresponding to this line is highlighted in the same way. If the user selects a line of the behavior level description display 301, the corresponding line of the RTL description display 302 is highlight-displayed, and if the user selects a line of the RTL description display 302, the corresponding line of the behavior level description display 301 is highlight-displayed. By this, the corresponding lines of the behavior level description and the RTL description can be easily identified.

If the user clicks on the $104^{th}$ line of the RTL description display 302, for example, the clicked line becomes bold red. In the case of the behavior level-RTL correspondence information 123 of the example in FIG. 2, the line corresponding to the $104^{th}$ line of the RTL description display 302 is the $44^{th}$ line of the behavior level description information 121, so the $44^{th}$ line of the behavior level description display 301 becomes bold red. The highlight display method is not limited to this example, but may be an arbitrary display method. It is also possible to design such that the user can select only underlined lines which have corresponding lines, and cannot select other lines.

A plurality of lines which are corresponded in the display may be selectable. In this case, lines in another area corresponding to the plurality of selected lines may be highlight-displayed by the same display method, or the respective correspondence relationship may be distinguished by color coding each selected line. The selection target and the location of the correspondence display need not be line units, but may be a character string unit (e.g. "i" or "tmp"). The selection method may be a keyboard instead of a pointing device, such as a mouse. In this case, possible methods are specification by cursor position, inputting a line number or inputting a character string.

The position where each element is disposed in the display screen 300 is not limited to this example, but may be an arbitrary position. The behavior level description display 301 and the RTL description display 302 may be in separate windows, or a separate window may be created for each file of the behavior level description and the RTL description. Both need not be displayed all the time, and it may be designed such that clicking in a status where one is displayed displays the corresponding other.

Now the processing of the correspondence display processing 112 will be described with reference to the flow chart in FIG. 4. This processing is executed by the control unit 110 using the program of the correspondence display processing 112. This processing may be started by the user starting up the program of the correspondence display processing 112, or may be started when the behavioral synthesis processing 111 ends.

First the user inputs the correspondence information (S401). The user inputs the file name, etc. of the behavior level-RTL correspondence information 123, which is/are input for the correspondence display processing 112. The control unit 110 can acquire the behavior level description information 121 and the RTL description information 122 to be displayed by reading the file names stored in the behavior level-RTL correspondence information 123. File names of the behavior level description information 121 and the RTL description information 122 respectively may be input by the user.

If the file names of the behavior level-RTL correspondence information 123 are predetermined, then input by the user is unnecessary. A structure to easily estimate the file names of the behavior level description information 121 and the RTL description information 122 from the files names of the behavior level-RTL correspondence information 123 (e.g. reattaching a suffix, such as a file extension) may be used. In this case, it is unnecessary to read the file names stores in the behavior level-RTL correspondence information 123 at this stage.

Then the behavior level description display processing is executed (S402). By this processing, the behavior level description information 121 is displayed on the behavior level description display 301 shown in FIG. 3. Then the RTL description display processing is executed (S403). By this processing, the RTL description information 122 is displayed on the RTL description display 302 shown in FIG. 3. Then the user input processing is executed (S404). By this processing, the correspondence display, according to the user selection, is executed. Details on processing from S402 to S404 will be described later. The processing sequence from S402 to S404 is not limited to this, but may be executed in other sequences. For example, S402 and S403 may be reversed in execution, or S404 may be executed after S402 or S403 is executed, and S402 or S403 may be executed when the user selects the behavior level description display 301 and the RTL description display 302.

Then it is judged whether the end instruction has been input (S405). For example, when the end button is disposed on the display screen 300, it is judged whether the user selected this button. If the user did not select the end button, S404 is executed again. If the user selected the end button, this processing ends.

Now the behavior level description display processing (S402) in FIG. 4 will be described with reference to the flow chart in FIG. 5. Just like the processing shown in FIG. 4, this processing is executed by the control unit 110 using the program of the correspondence display processing 112.

First the behavior level description is displayed in text (S501). The behavior level description information 121 acquires in S401 is displayed on the behavior level description display 301 on the display unit 130. For example, if a plurality of files of the behavior level description information 121 exist in the behavior level-RTL correspondence information 123, all the files may be displayed. Also, regardless the file format stored in the behavior level description information 121, the character strings of text may be displayed.

Then the line numbers having a corresponding destination in the behavior level description are searched (S502). From the line number list of the behavior level description information 121 included in the behavior level-RTL correspondence information 123, the line numbers of the behavior level description information 121 having a corresponding line number of the RTL description information 122 are searched. For example, in the case of the line number list of main.c in FIG. 2A, it is judged whether line numbers pointed to by the bi-directional pointer are lines having a corresponding line number in the RTL description information 122. In the range shown in FIG. 2A, line numbers 40, 42, 43, 44, 46, 49, 50, 51, 52, 53 and 57 are detected from the line number list in main.c. In FIG. 2B, it is judged whether the line numbers listed in the file name main.c are line numbers having a corresponding line number in the RTL description information 122. In the range shown in FIG. 2B, the line numbers 44 and 46 are detected. In the case of the example in FIG. 2B, all correspondences are not listed, so the lines corresponding to main.c and the lines corresponding to main.v may not match in some cases, but they will match if all information is listed.

Then lines of the applicable line numbers are underlined (S503). Based on the line number of the behavior level description information 121 searched in S502, all the applicable lines in the behavior level description display 301 are underlined. For example, the display of a character string of an applicable line is changed to an underlined display which the user can selected by a mouse. By this, the behavior level description display 301 is displayed, and in this status the user can select this display.

S501-S503 need not be in this sequence. The sequence of S501 and S502, for example, may be reversed. A plurality of processings may be executed simultaneously (in parallel). For example, S501 and S503 may be executed in parallel after S502. In this case, it is unnecessary to execute the processing of changing the character string displayed in 501 to the underlined display in S503, and the lines to be underline-displayed in S503 can be underline-displayed from the beginning.

Now the RTL description display processing (S403) in FIG. 4 will be described with reference to the flow chart in FIG. 6. Just like the processing shown in FIG. 4, this processing is executed by the control unit 110 using the program of the correspondence display processing 112. This processing will be described in brief since this is the same as the behavior level description display processing in FIG. 5.

First the RTL description is described in text (S601). The RTL description information 122 acquired in S401 is displayed in the RTL description display 302 on the display unit 130. Then the line numbers having a corresponding destination in the RTL description are searched (S602). From the line number list of the RTL description information 122, included in the behavior level-RTL correspondence information 123, the line numbers of the RTL description information 122 having corresponding line numbers in the behavior level description information 121 are searched. Then a line with an applicable line number is underlined (S603). Based on the line number of the RTL description information searched in S602, all applicable lines are underlined in the RTL description display 302. By this, the RTL description display 302 is displayed, and in this status, the user can select this display.

Figure 7:
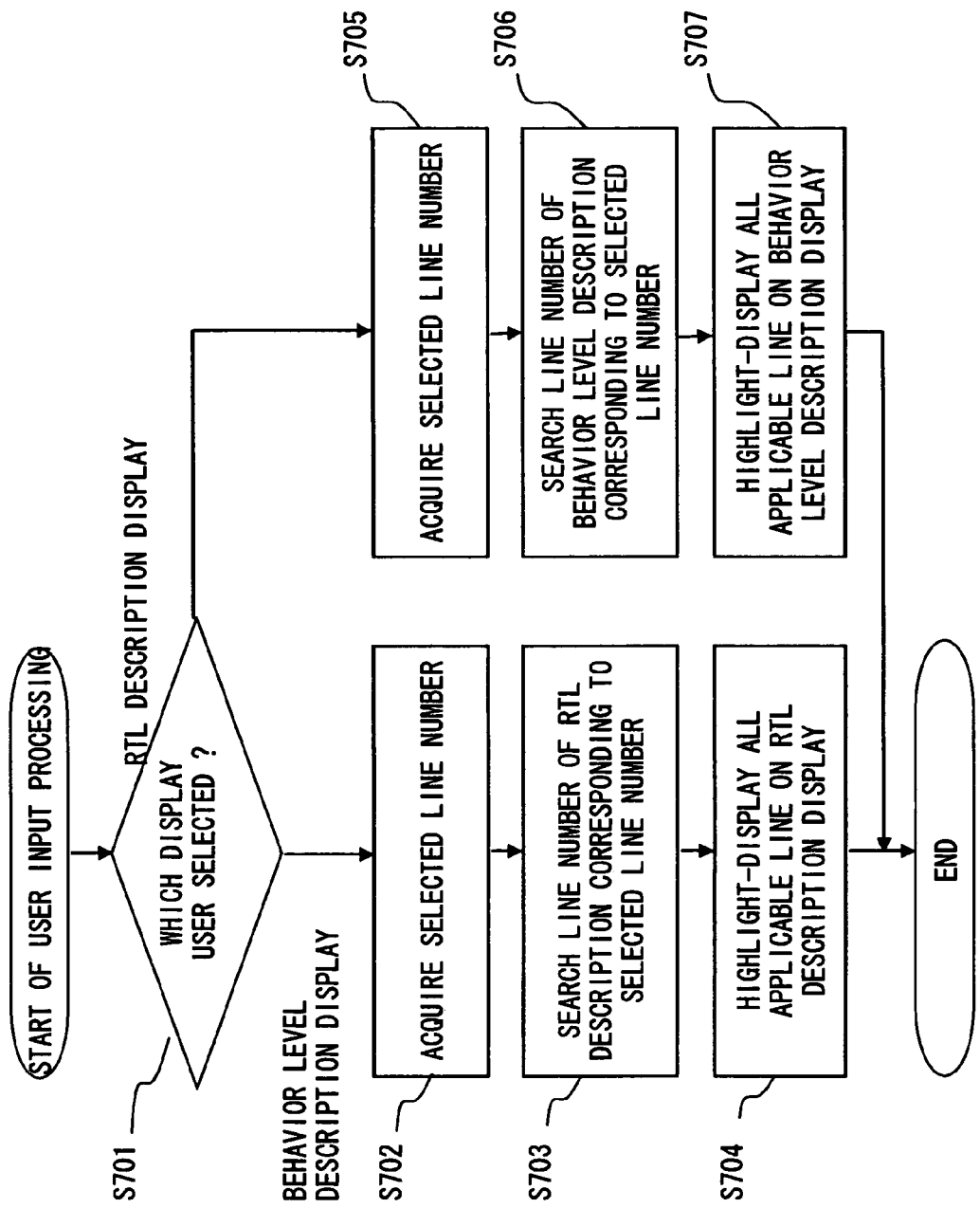
FIG. 7 is a flow chart depicting the operation of the user input processing according to the present invention.

Now the user input processing (S404) in FIG. 4 will be described with reference to the flow chart shown in FIG. 7.

Figure 4:
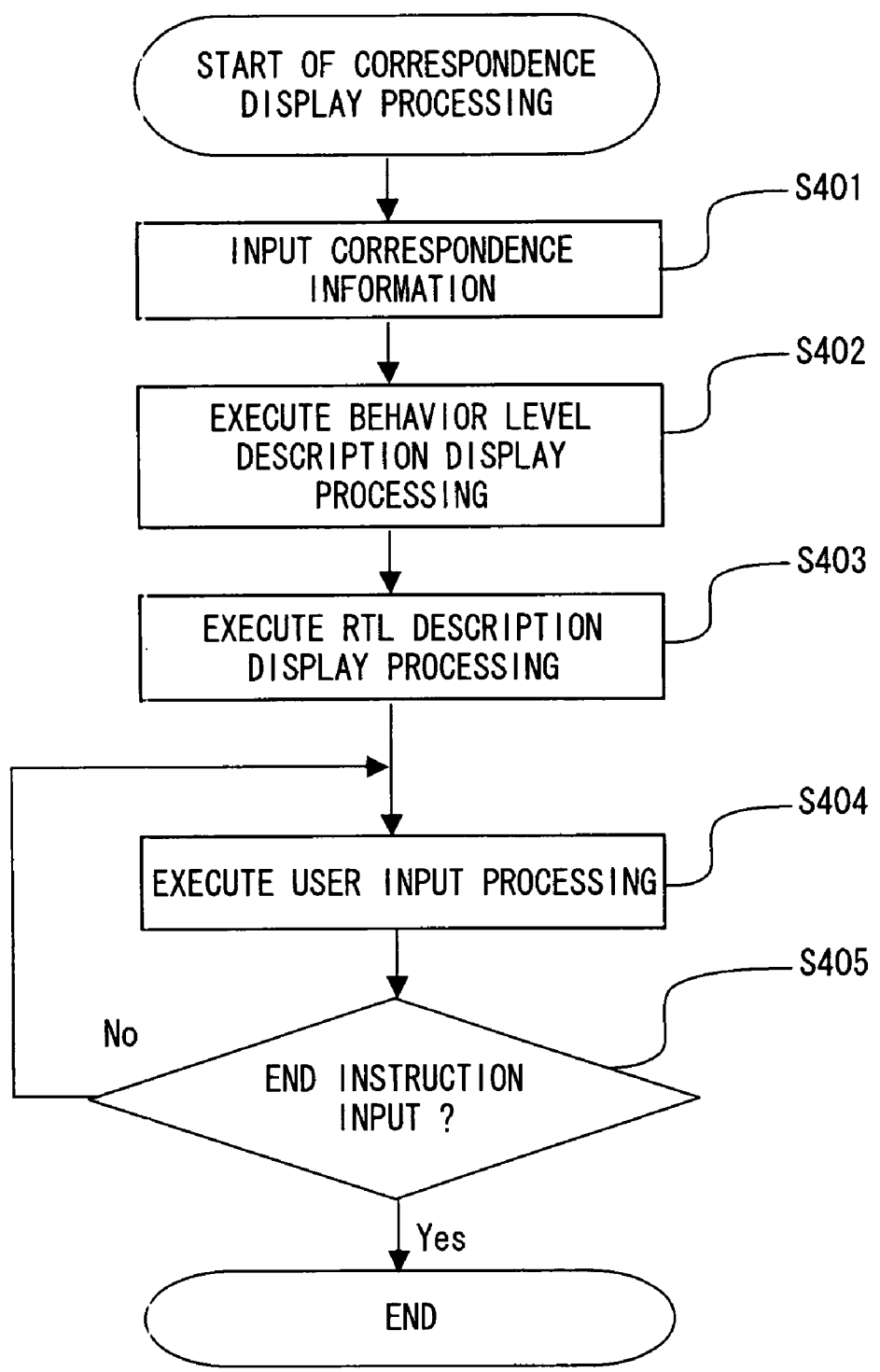
FIG. 4 is a flow chart depicting the display processing according to the present invention.

Just like the processing shown in FIG. 4, this processing is executed by the control unit 110 using the program of the correspondence display processing 112.

First it is judged which display the user selected (S701). Input by the user through the input unit 140 is accepted, and it is judged which display the user selected on the display screen 300 in FIG. 3. Depending on the selected location, S702 or S705 is executed. Here processing in the case of selecting a display other than the behavior level description display 301 and the RTL description display 302 is omitted.

If the behavior level description display 301 is selected in S701, the selected line number is acquired (S702). If the user selected the behavior level description display 301, the line number of the selected line is acquired in the behavior level description display 301. At this time, the character string of the line of the acquired line number may be highlight-displayed in bold red, for example.

Then the line number of the RTL description corresponding to the selected line number is searched (S703). From the line number list of the behavior level description information 121 included in the behavior level-RTL correspondence information 123, the line number acquired in S702 is searched, and all the line numbers of the RTL description information 122 corresponding to this line are determined.

Then all the applicable lines on the RTL description display 302 are highlight-displayed (S704). Based on the line numbers of the RTL description information 122 searched and determined in S704, all the applicable lines are highlight-displayed in the RTL description display 302. For example, the display of the character string of the applicable line is changed into a bold red display.

If the RTL description display 302 is selected in S701, the selected line number is acquired (S705). If the user selected the RTL description display 302, the line number of the selected line is acquired in the RTL description display 302. Just like S702, the selected line may be highlight-displayed.

Then the line number of the behavior level description corresponding to the selected line number is searched (S706). From the line number list of the RTL description information 122 included in the behavior level-RTL correspondence information 123, the line number acquired in S705 is searched, and all the line numbers of the behavior level description information 121 corresponding to this line are determined.

Then all the applicable lines on the behavior level description display 301 are highlight-displayed (S707). Based on the line numbers of the behavior level description information 121 searched and displayed in S706, all the applicable lines are highlight-displayed, just like S704, on the behavior level description display 301.

By this method, the RTL description corresponding to the behavior level description can be displayed according to the selection by the user, and the behavior level description corresponding to the RTL description can be displayed. Therefore the user can easily specify the location in the RTL description corresponding to the location in the behavior level description, and can accurately check the kind of RTL description the behavior level description will become. Therefore design efficiency can be improved, and design defects can be decreased.

Second Embodiment

Now the configuration of the circuit design support system according to Second Embodiment will be described with reference to the block diagram shown in FIG. 8. The circuit design support system according to the present embodiment executes processing to correspond and display the behavior level description, the RTL description and the delay report. In addition to the configuration in FIG. 1, this circuit design support system further comprises a logical synthesis processing 113 in the control unit 110, and comprises the intra-RTL correspondence information 124, gate-RTL correspondence information 125 and delay report information 126 in the storage unit 110.

The delay report information 126 is the delay information of a path of which the start point is the input terminal or storage element, and the end point is the output terminal or storage element. The delay report information 126 is generated by the logical synthesis processing 113, and is stored in the storage unit 120. The delay report information 126 is comprised of an arbitrary number of paths, and the format thereof is an internal format (e.g. binary format) of logical synthesis. Therefore data on the delay time can be directly referred to from the control unit 110, without executing such processing as a character string analysis of the text.

The delay report is information acquired as a result of analyzing the delay of the behavior of each gate at logical synthesis. The delay report is comprised of the delay information on one or more paths. The delay information of a path includes, for example, the hierarchy and instance name of each gate from the start point to the end point of the path, the delay time of each gate, the delay time of an entire patch, and whether the delay rule was violated or not. Details on the delay report will be described later.

The intra-RTL correspondence information 124 is the correspondence information between the instance name of a component (e.g. computing element, selector, register, terminal, wire) in the RTL description and the line number in the RTL description. The intra-RTL correspondence information 124 is generated by the behavioral synthesis processing 111, and is stored in the storage unit 120. The data structure will be described later.

If the correspondence of the instance name of a component in the RTL description and the line number of the RTL description can be recognized by the RTL description information 122, then intra-RTL correspondence information 124 is unnecessary. In this case, the RTL description information 122 must be searched.

The gate-RTL correspondence information 125 is the correspondence information between the instance name of the gate in the delay report and the instance name of the component in the RTL description. The gate-RTL correspondence information 125 is generated by the logical synthesis processing 113, and is stored in the storage unit 120. The data structure will be described later.

The logical synthesis processing 113 is executed by the control unit 110. In the logical synthesis processing 113, the RTL description information 122 is input and logical synthesis is performed on this to generate the delay report information 126, and this delay report information 126 is stored in the storage unit 120. The logical synthesis processing 113 creates the gate-behavior level correspondence information 125 at logical synthesis, and stores it in the storage unit 120. The logical synthesis processing 113 may be executed in a system that is separate from the circuit design support system 100. In logical synthesis, a gate net list, which is the connection information between gates, is output, in addition to the delay report information 126 and the gate-behavior level correspondence information 125.

In the behavioral synthesis processing 111 according to the present embodiment, intra-RTL correspondence information 124 is created in addition to the RTL description information 122 and the behavior level-RTL correspondence information 123 when behavioral synthesis is performed for the behavior level description information 121, and this information is stored in the storage unit 120.

In the correspondence display processing 112 in the present embodiment, the delay report information 126, intra-RTL correspondence information 124 and gate-RTL correspondence information 125 are input in addition to the behavior level description information 121, RTL description information 122 and behavior level-RTL correspondence information 123, and the behavior level description, RTL description and delay report are corresponded and displayed on the display unit 130. Detailed operation will be described later.

Now the data structure of the intra-RTL correspondence information 124 and the gate-RTL correspondence information 125 will be described with reference to FIG. 9. FIG. 9A shows an example of the data of the intra-RTL correspondence information 124. FIG. 9B shows an example of the data of the gate-RTL correspondence information 125.

As FIG. 9A shows, in the intra-RTL correspondence information 124, the file name of the RTL description, the instance name of a component of the RTL description and the line number of the RTL description where this instance name is written are included, and each element is corresponded to one another. In this example, the instance name of the component "INST_5" in the file "main.v" of the RTL description corresponds to the 104$^{th}$ line of the RTL description. In the intra-RTL correspondence information 124, the hierarchical information, the function type on whether it is an adder, subtractor or register, the input and output terminal names of the instance and the bit width information may also be included.

AS FIG. 9B shows, in the gate-RTL correspondence information 125, the path name, instance name of a gate in the delay report, file name of the RTL description, instance name of a component in the RTL description and bit position of a component in the RTL description are included, and the respective elements are corresponded with one another. In the bit position of a component in the RTL description, the bit of FF (flip-flop) of the component in the RTL description is stored in the case when the component of the RTL description is a multi-bit register. In this example, the instance name "RG_28_reg1" of the gate in the path name "path 1" and "path 2" corresponds to the instance name "RG_28" of the component in the file "main.v" of the RTL description and the bit position "1" of the component.

For an instance which is not separated for each bit in the gate level, the bit position remains blank. For example, in FIG. 9B, instances with the instance name "INST_4" and "INST_5" of the components of the RTL description are not separated into each bit on the gate level, so the bit position of a component of the RTL description is slashed, and remains blank. In the example in FIG. 9B, the instance name of the gate of the delay report and the instance name of the component of the RTL description correspond to each other one-to-one, but may correspond one-to-plural, plural-to-one or plural-to-plural. In this case, a plurality of instances are listed in the columns of the instance names of the gate of the delay report and the instance names of the components of the RTL description. Or an instance may be limited to one for each column, and a line may be divided. The gate-RTL correspondence information 125 may not have information on the bit position of a component of the RTL description. In this case, if the component of the RTL description is a multi-bit register, the instance name of the gate of the delay report and the instance name of the component of the RTL description correspond to each other as plural-to-one.

Now an example of the display screen of the correspondence display processing 112 will be described with reference to FIG. 10. FIG. 10A is an example of the display screen for displaying the delay report. FIG. 10B is a diagram depicting the path of the delay report in FIG. 10A.

The display screen 1000 shown in FIG. 10A comprises a delay repot display 100 for displaying the delay report information 126. In 1000 in FIG. 10A, only one path, path 1, is displayed, but actually a plurality of paths are listed in the same display format before and after the displayed position. The correspondence display processing 112 has the display screen 300 shown in FIG. 3, and the display screen 1000, so as to display the behavior level description information 121, the RTL description information 122 and the delay report information 126. The display screen 300 and the display screen 1000 may be in one window or may be displayed in separate windows. Just like the display screen 300, a tab 303 may be created for each path, or a menu 304 for search may be created.

Now the content of the delay report to be displayed on the delay report display 1001 will be described. The path "path1" is a path between the first bit of the register "RG_28" and the thirty first bit of the register "RG_28" in the hierarchy "INST_2", as shown in FIG. 10B, and this path passes through the hierarchy "INST_5" and the hierarchy "INST_4". "RG_28" is a flip-flop (FF). In this delay report, the line starting with "INST_2" indicates the gate or terminal of the hierarchy where this path passes through. "/" included in each line indicates the separation of hierarchies.

For example, on the fourth line from the top in the delay report display 1001, "INST_2" indicates the hierarchy, "RG_28_reg1" indicates the instance name, "No1" indicates the terminal name of an instance, and "TBDFHAX1" indicates the element name. "RG_28_reg1" indicates the FF (flip-flop) at the first bit of the multi-bit register called "RG_28" in the RTL description. In the RTL description, the multi-bit register having the instance name "RG_28" is separated into a 1-bit FF in the gate. At this time, in this example the instance name of RTL+"_reg"+ the bit position is assigned as the instance name of the gate.

The column of Incr, which is the second column from the right end in the delay report display 1001, indicates the delay time of each element. The column of Path, which is the first column at the right end in the delay report display 1001, indicates the cumulative value of the delay time of each element. "r" at the right of the delay time indicates the delay time at the rise of the signal, and "f" indicates the delay time at the fall of the signal.

"data arrival time" on the ninth line from the bottom of the screen is the delay time of the entire path. "data required time" on the third line from the bottom of the screen is the reference delay value determined from the operating frequency. "slack" on the first line at the bottom of the screen indicates whether this delay time of the path violates the delay rule. "(MET)" to the right of "slack" indicates that the delay time value of the path is within the range of the reference delay value and does not violate the delay rule. If the delay time of the path exceeds the reference delay value, then the delay rule is violated, and "(VIOL)", for example, is displayed to the right of "slack".

Now the correspondence display processing 112 will be described with reference to the flow chart shown in FIG. 12. Just like the processing shown in FIG. 4, this processing is executed by the control unit 110 using the program of the correspondence display processing 112. S1201 to S1203 are the same as S401 to S403 in FIG. 4 respectively, and S1206 is the same as S405 in FIG. 4, for which description will be omitted unless necessary.

First the user inputs the correspondence information (S1201). The user inputs a file name, etc. of the behavior level-RTL correspondence information 123, intra-RTL correspondence information 124 and gate-RTL correspondence information 125, which are inputs of the correspondence display processing 112. By this, the behavior level-RTL correspondence information 123 and intra-RTL correspondence information 124, the behavior level description information 121 and RTL description information 122 to be displayed, can be acquired, and by the gate-RTL correspondence information 125, the delay report information 126 can be acquired. The user may input the file name, etc. of the behavior level description information 121, RTL description information 122 and delay report information 126.

Then the behavior level description display processing is executed (S1202), and the behavior level description display 301 is displayed. And then the RTL description display processing (S1203) is executed, and the RTL description display 302 is displayed.

Then the delay report display processing is executed (S1204). By this processing, the delay report information 126 is displayed on the delay report display 1001 shown in FIG. 10. Then the user input processing is executed (S1205). By this processing, the correspondence display according to the user selection is executed. Details on the processing in S1204 and S1205 will be described later.

Then it is judged whether the end instruction has been input (S1206). If the user did not input the end instruction, S1205 is executed again, and if the end instruction has been input, this processing ends.

Now the delay report display processing (S1204) in FIG. 12 will be described with reference to the flow chart shown in FIG. 13. Just like the processing shown in FIG. 12, this processing is executed by the control unit 110 using the program of the correspondence display processing 112.

In the delay report display processing, the delay report is displayed in text (S1301). This processing is the same as S501 in FIG. 5. The delay report information 126 acquired in S1201 is displayed in the delay report display 1001 on the display unit 130. The delay report information 126 of the present embodiment has an internal format, such as binary format, stored in the storage unit 120, so each data is converted into text format to which the necessary character strings are added, and is displayed as FIG. 10.

Figure 5:
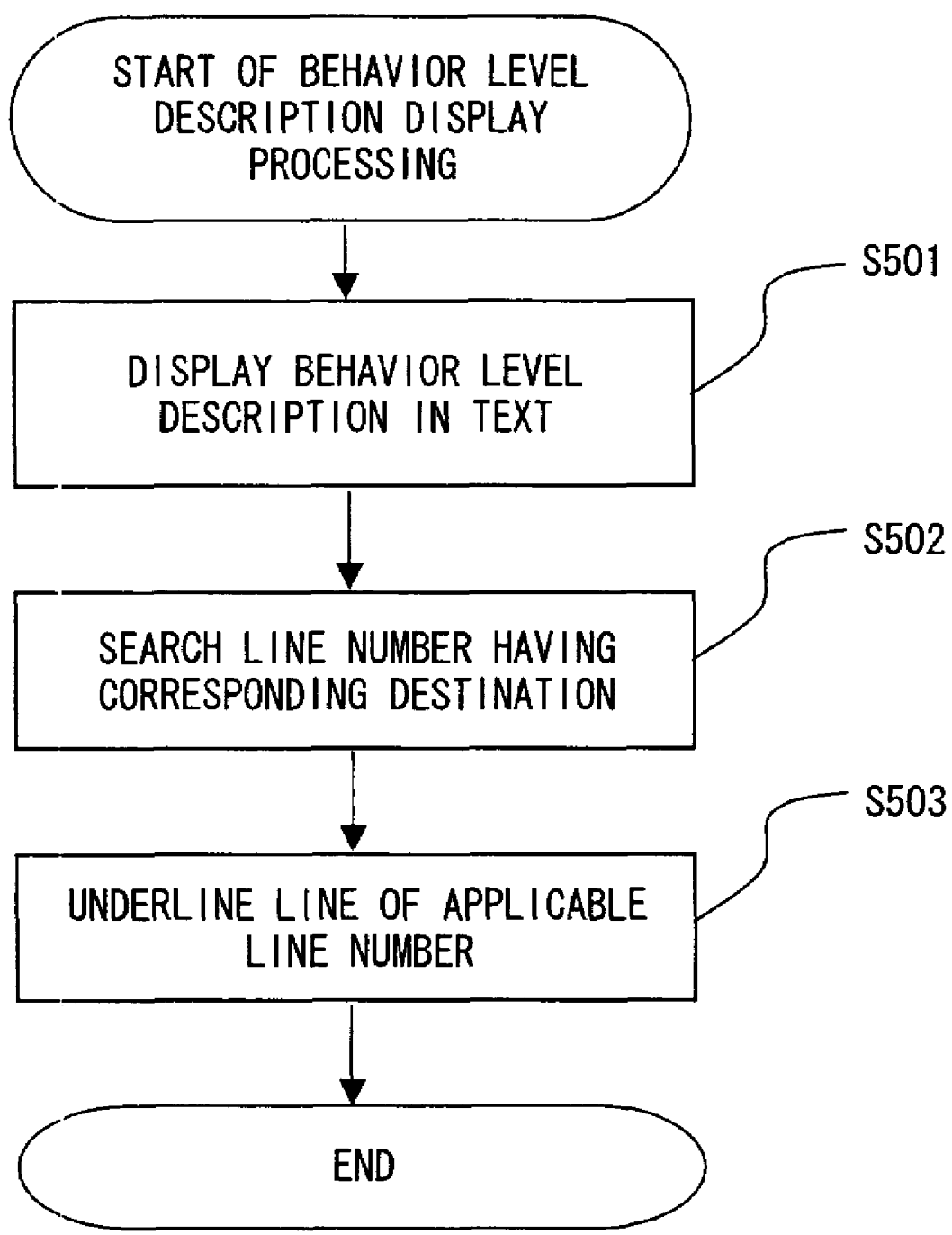
FIG. 5 is a flow chart depicting the operation of the behavior level description display processing according to the present invention.
Figure 6:
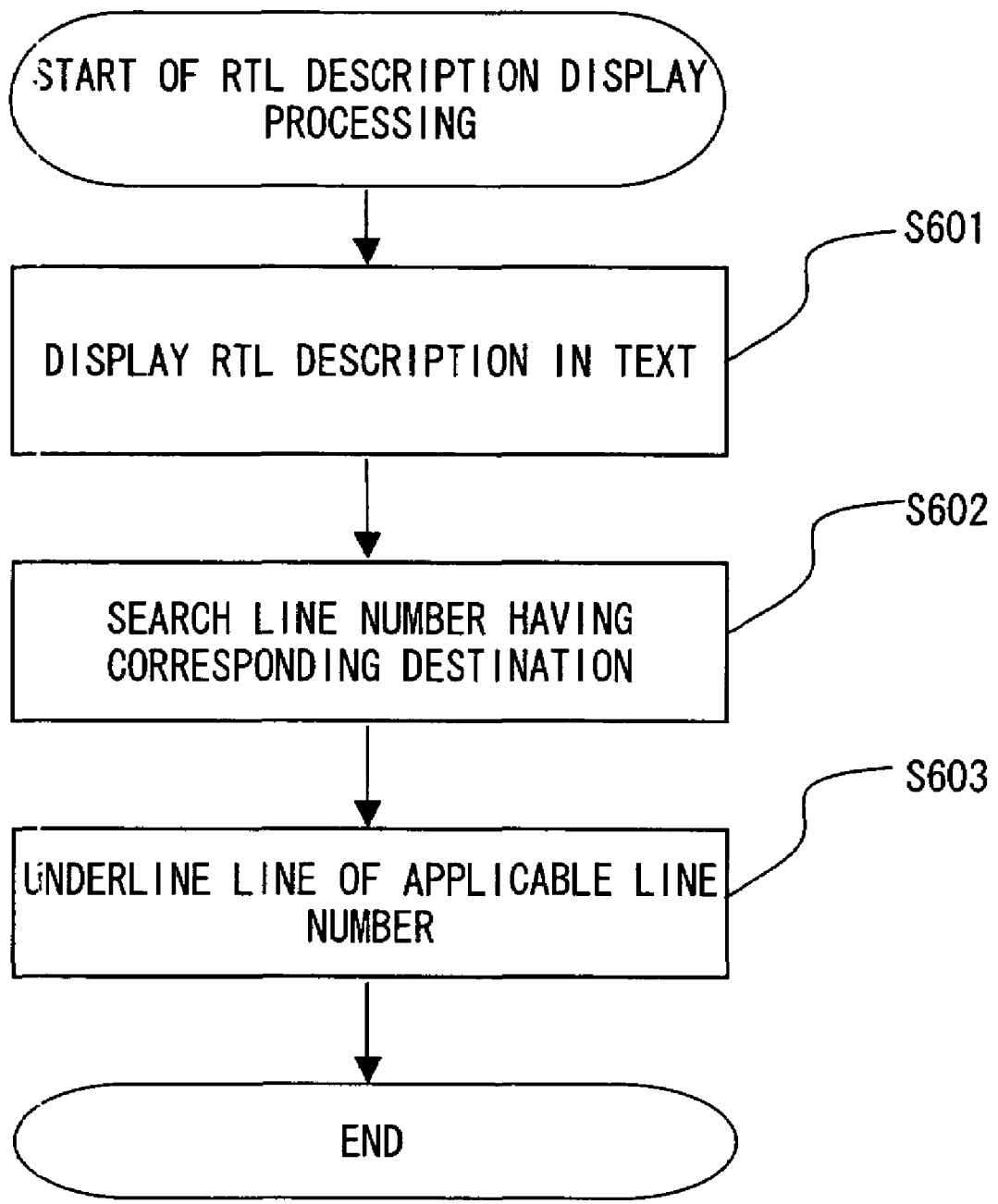
FIG. 6 is a flow chart depicting the operation of the RTL description display processing according to the present invention.

Just like FIG. 5 and FIG. 6, lines having the corresponding destination of the instance name of the delay report may be underlined.

Now the user input processing (S1205) in FIG. 12 will be described with reference to the flow chart in FIG. 14. Just like the processing shown in FIG. 12, this processing is executed by the control unit 110 using the program of the correspondence display processing 112. S1401 to S1407 are the same as S701 to S707 in FIG. 7, for which description is omitted.

If the display report display 1001 is selected in S1401, all the instance names included in the selected path in the delay report are acquired (S1408).

Then the instance names of the RTL description corresponding to the acquired instance names are searched (S1409). For each of the instance names acquired in S1408, an instance name of a gate of the delay report included in the gate-RTL correspondence information 125 is searched, and the instance name of the component of the RTL description corresponding to the instance name of the gate of the delay report is determined.

Then the line numbers of the RTL description corresponding to the acquired instance names are searched (S1410). For each of the instance names searched and determined in S1409, the instance name of the component of the RTL description included in the intra-RTL correspondence information 124 is searched, and the line number of the RTL description corresponding to the instance name of the component of the RTL description is determined.

Then all the applicable lines on the RTL description are highlight-displayed (S1411). Just like S704 in FIG. 7, based on the line numbers of the RTL description information 122 searched and determined in S1410, all the applicable lines are highlight-displayed in the RTL description display 302. At this time, for the behavior level description information 121 corresponding to the line of the RTL description information 122 which is highlight-displayed, the applicable behavior level description display 301 may also be highlight-displayed.

By this method, the RTL description and the delay report corresponding to the behavior level description can be displayed according to the selection by the user, and the behavior level description and the delay report corresponding to the RTL description can be displayed, and the behavior level and the RTL description corresponding to the delay report can be displayed. Therefore the user can easily and accurately specify the location in the behavior level description and the location in the RTL description, which indicates the delay rule violation in the delay report. As a result, the location of the delay rule violation can be efficiently corrected, the design efficiency can be improved, and design defects can be decreased.

Third Embodiment

Figure 15:
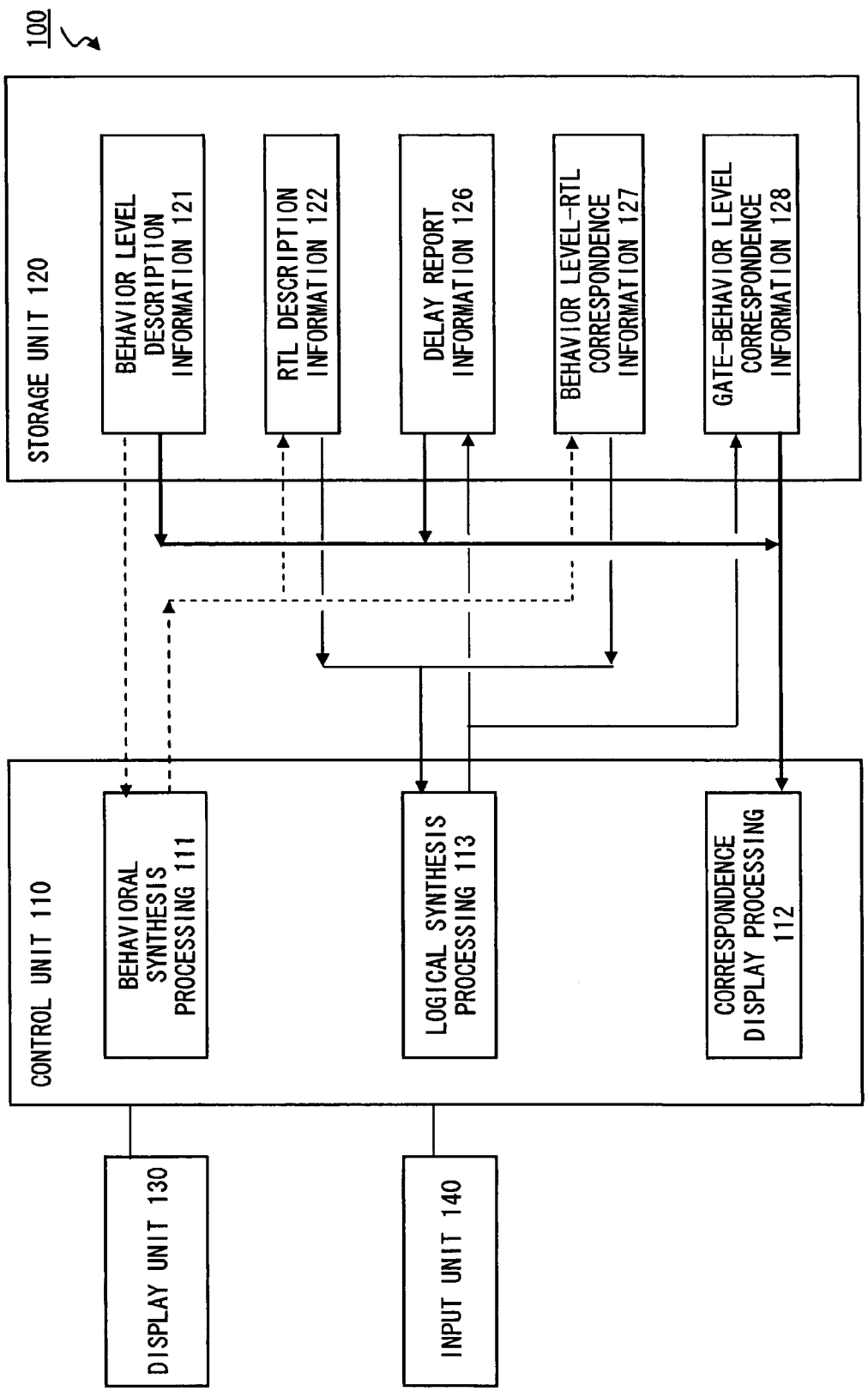
FIG. 15 is a functional block diagram depicting the circuit design support system according to the present invention.

Now the configuration of the circuit design support system according to Third Embodiment will be described with reference to the block diagram shown in FIG. 15. The circuit design support system according to the present embodiment executes processing to correspond and display the behavior level description and the delay report. This circuit design support system 100 comprises the behavior level-RTL correspondence information 127 and the gate-behavior level correspondence information 128 instead of the behavior level-RTL correspondence information 123, intra-RTL correspondence information 124 and gate-RTL correspondence information 125 in FIG. 8.

Figure 8:
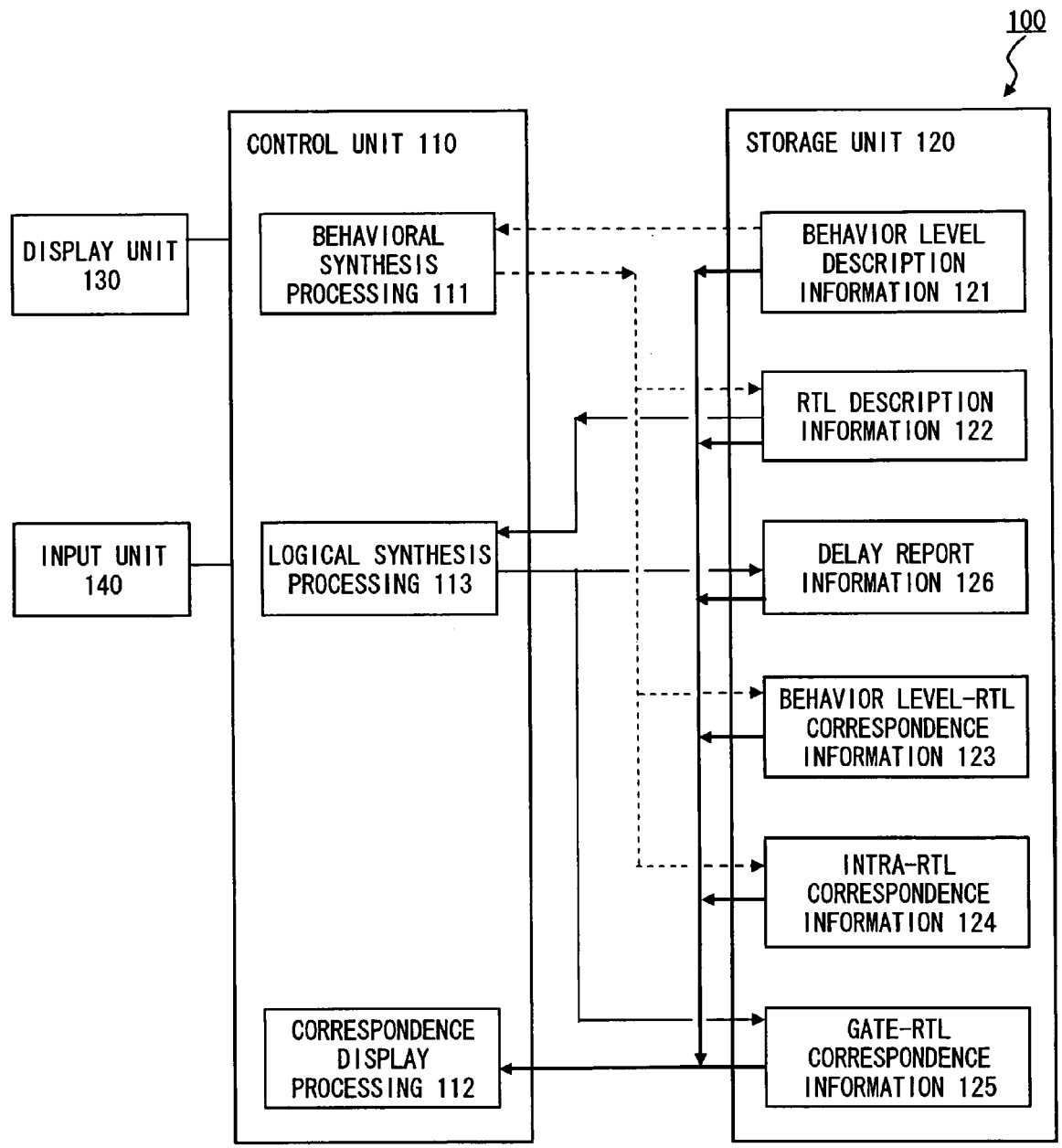
FIG. 8 is a functional block diagram depicting the circuit design support system according to the present invention.

Unlike the behavior level-RTL correspondence information 123 in FIG. 8, the behavior level-RTL correspondence information 127 is the correspondence information between the instance names of the components in the RTL description and the line numbers of the behavior level description. The behavior level-RTL correspondence information 127 is generated by the behavioral synthesis processing 111, and stored in the storage unit 120. The data structure will be described later.

The gate-behavior level correspondence information 128 is the correspondence information between the instance names of the gate of the delay report and the line numbers of the behavior level description. The gate-behavior level correspondence information 128 is generated by the logic synthesis processing 113, and is stored in the storage unit 120. The data structure will be described later.

In the behavioral synthesis processing 111 according to the present embodiment, the RTL description information 122 and the behavior level-RTL correspondence information 127 are created and stored in the storage unit 120 when the behavioral synthesis is performed on the behavior level description information 121.

In the logical synthesis processing 113 according to the present embodiment, the behavior level-RTL correspondence information 127 is input in addition to the RTL description information 122, and the delay report information 126 and the gate-behavior level correspondence information 128 are created by logical synthesis, and are stored in the storage unit 120.

In the correspondence display processing 112 according to the present embodiment, the behavior level description information 121, the delay report information 126 and the gate-behavior level correspondence information 128 are input, and the behavior level description and the delay report are corresponded and displayed on the display unit 130. Details operation will be described later.

Now the data structure of the behavior level-RTL correspondence information 127 and the gate—behavior level correspondence information 128 will be described with reference to FIG. 16. FIG. 16A shows an example of the data of the behavior level-RTL correspondence information 127, and FIG. 16B shows an example of the data of the gate-behavior level correspondence information 128.

As FIG. 16A shows, in the behavior level-RTL correspondence information 127, a file name of the RTL description, an instance name of a component of the RTL description, a file name of the behavior level description and a line number of the behavior level description are included, and each element is corresponded to one another. In this example, the instance name "INST_5" of the component in the file "main.v" of the RTL description corresponds to the 44$^{th}$ line of the file "main.c" of the behavior level description.

As FIG. 16B shows, in the gate-behavior level correspondence information 128, a path name of the delay report, an instance name of a gate in the delay report, a file name of the behavior level description and a line number of the behavior level description are included and corresponded to one another. In this example, the instance name "RG_28_reg1" of the gate in the paths, "path1" and "path 2", in the delay report corresponds to the 10$^{th}$ and 85$^{th}$ lines of the file "main.c" of the behavior level description.

In the correspondence display processing 112 according to the present embodiment, the behavior level description information 121 and the delay report information 126 are corresponded and displayed, so the display screen of this processing comprises the behavior level description display 301 and the delay report display 1001 in FIG. 3 and FIG. 10.

Figure 12:
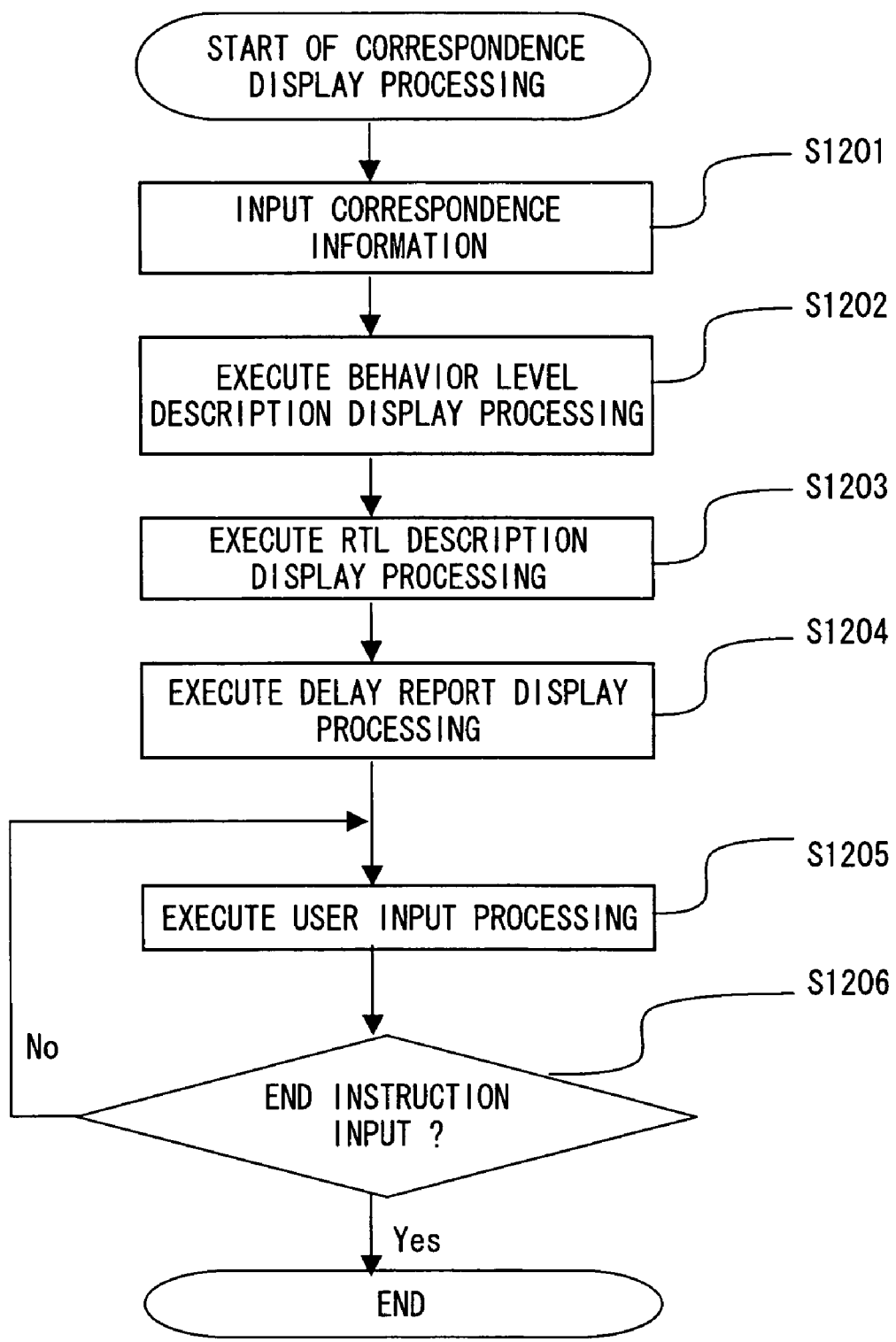
FIG. 12 is a flow chart depicting the operation of the display processing according to the present invention.
Figure 13:
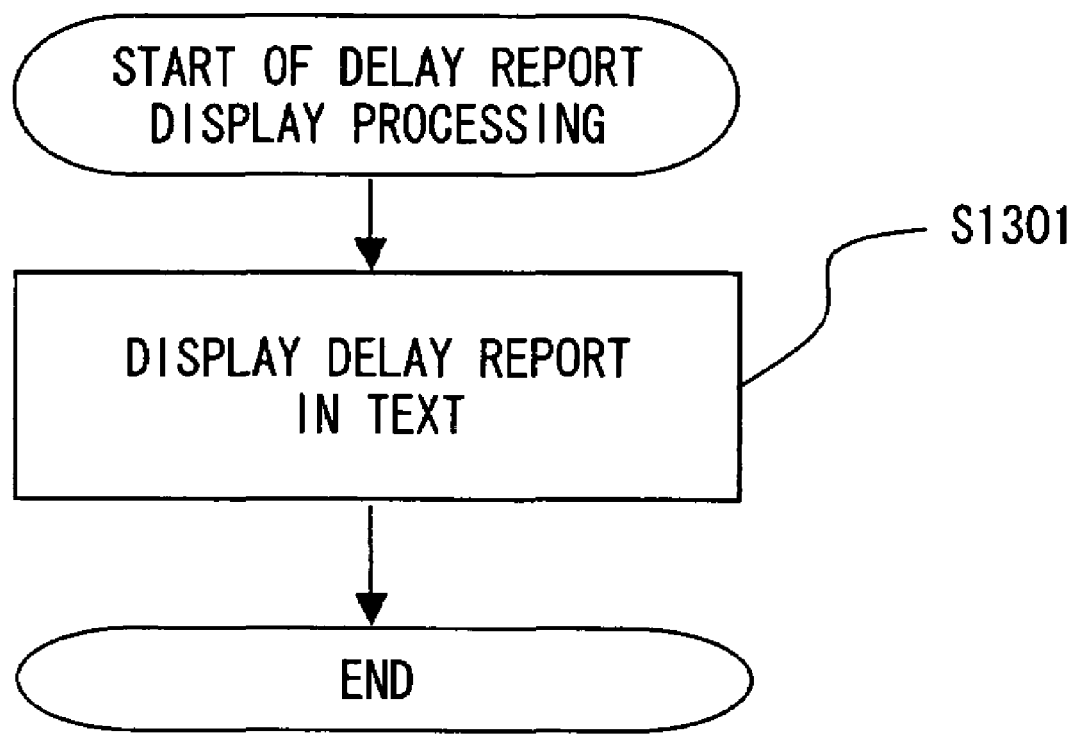
FIG. 13 is a flow chart depicting the operation of the delay report display processing according to the present invention.

The processing of the correspondence display processing 112 becomes the processing on the behavior level description processing 121 and the delay report information 126 in the flow chart shown in FIG. 12, that is S1201, S1202, S1204, S1205 and S1206.

Figure 17:
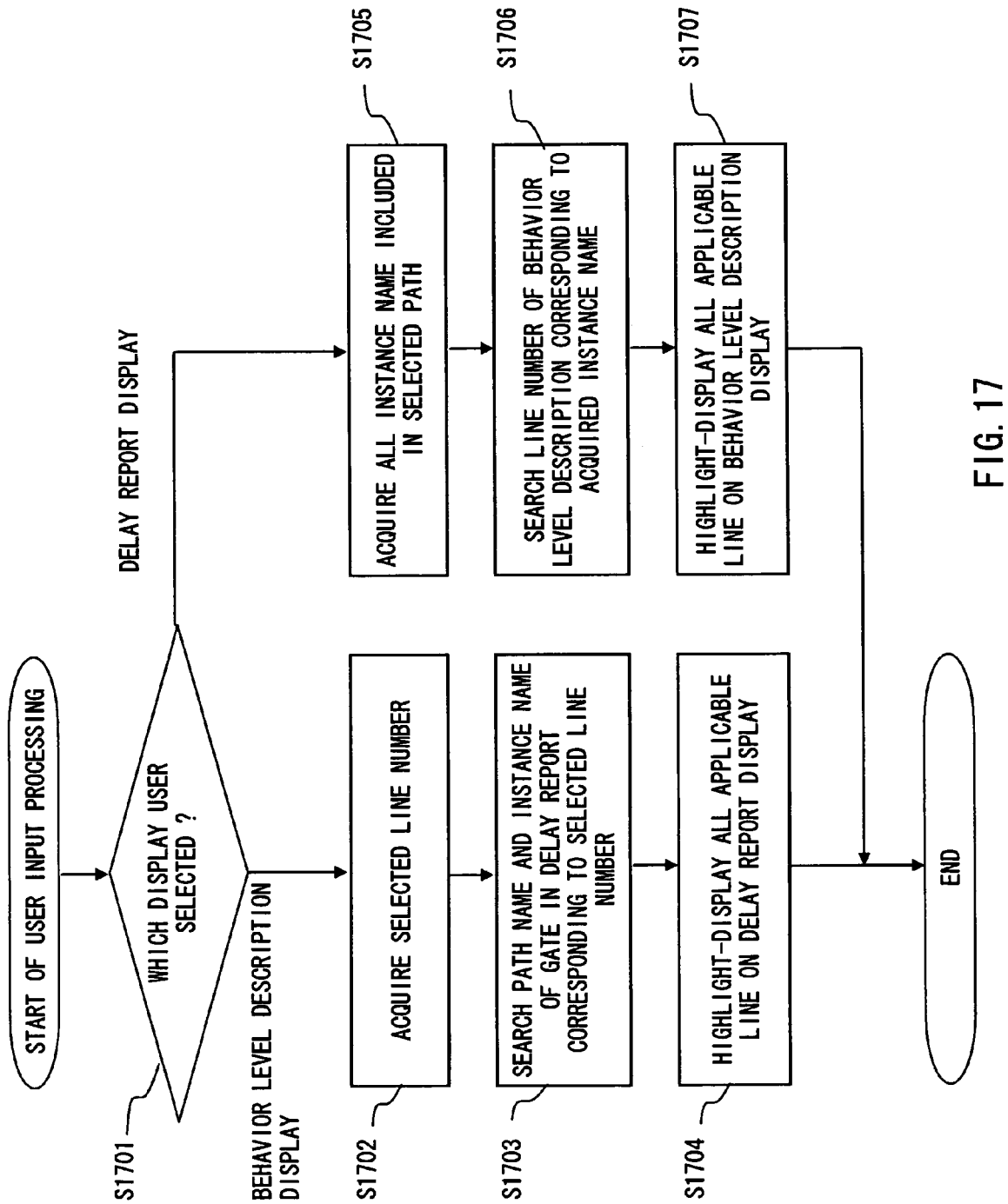
FIG. 17 is a flow chart depicting the operation of the user input processing according to the present invention.

Now the user input processing (S1205) in this processing will be described with reference to the flow chart in FIG. 17. Just like the processing shown in FIG. 14, this processing is executed by the control unit 110 using the program of the correspondence display processing 112. S1701 and S1702 are the same as S1401 and S1402 in FIG. 14. S1705 is the same as S1408 in FIG. 14. And S1707 is the same as S1407 in FIG. 14. Therefore descriptions for these are omitted unless it is necessary. In S1703, the path name and the instance name of the gate of the delay report are searched by the line number of the behavior level description using the gate-behavior level correspondence information 128 in FIG. 16B (details described later). In S1704, all the applicable lines of the delay report display 1001 are highlight-displayed (details described later). In S1706, the line number of the behavior level description is searched by the path name and the instance name of the gate of the delay report using the gate-behavior level correspondence information 128 in FIG. 16B (details described later).

First it is judged which display the user selected (S1701), and S1702 or S1705 is executed depending on the location selected by the user. If the behavior level description display 301 is selected in S1701, the selected line number is acquired (S1702).

Then the line numbers of the delay report corresponding to the selected line number are searched (S1703). From the line numbers of the behavior level description information 121 included in the gate-behavior level correspondence information 128, the line numbers acquired in S1702 are searched, and the path name and the instance name of the gate of the delay report corresponding to these lines are all determined.

Then all the applicable lines on the delay report display 1001 are highlight-displayed (S1704). Based on the path name and the instance name of the gate of the delay report searched and determined in S1703, the delay report information 126 is searched, and all the applicable lines are highlight-displayed in the delay report display 1001.

If the delay report display 1001 is selected in S1701, all the instance names of the path selected in the delay report are acquired (S1705).

Then the line number of the behavior level description corresponding to the acquired instance names is searched (S1706). For each instance name acquired in S1705, an instance name of the gate of the delay report included in the selected path is searched in the gate-behavior level correspondence information 128, and all the line numbers of the behavior level description information 121 corresponding to the instance name of the path are acquired.

Then all the applicable lines on the behavior level description display are highlight-displayed (S1707). Based on the line numbers of the behavior level description information 121 searched and determined in S1706, all the applicable lines are highlight-displayed in the behavior level description display 301.

By this method, the delay report corresponding to the behavior level description can be displayed according to the selection by the user, and the behavior level description corresponding to the delay report can be displayed without going through an RTL description. Therefore the user can easily and accurately specify the location in the behavior level description, which indicates the delay rule violation in the delay report. Also the correspondence information required for the correspondence display processing is only the gate-behavior level correspondence information 128, so the data capacity required for the system can be decreased.

Fourth Embodiment

Figure 18:
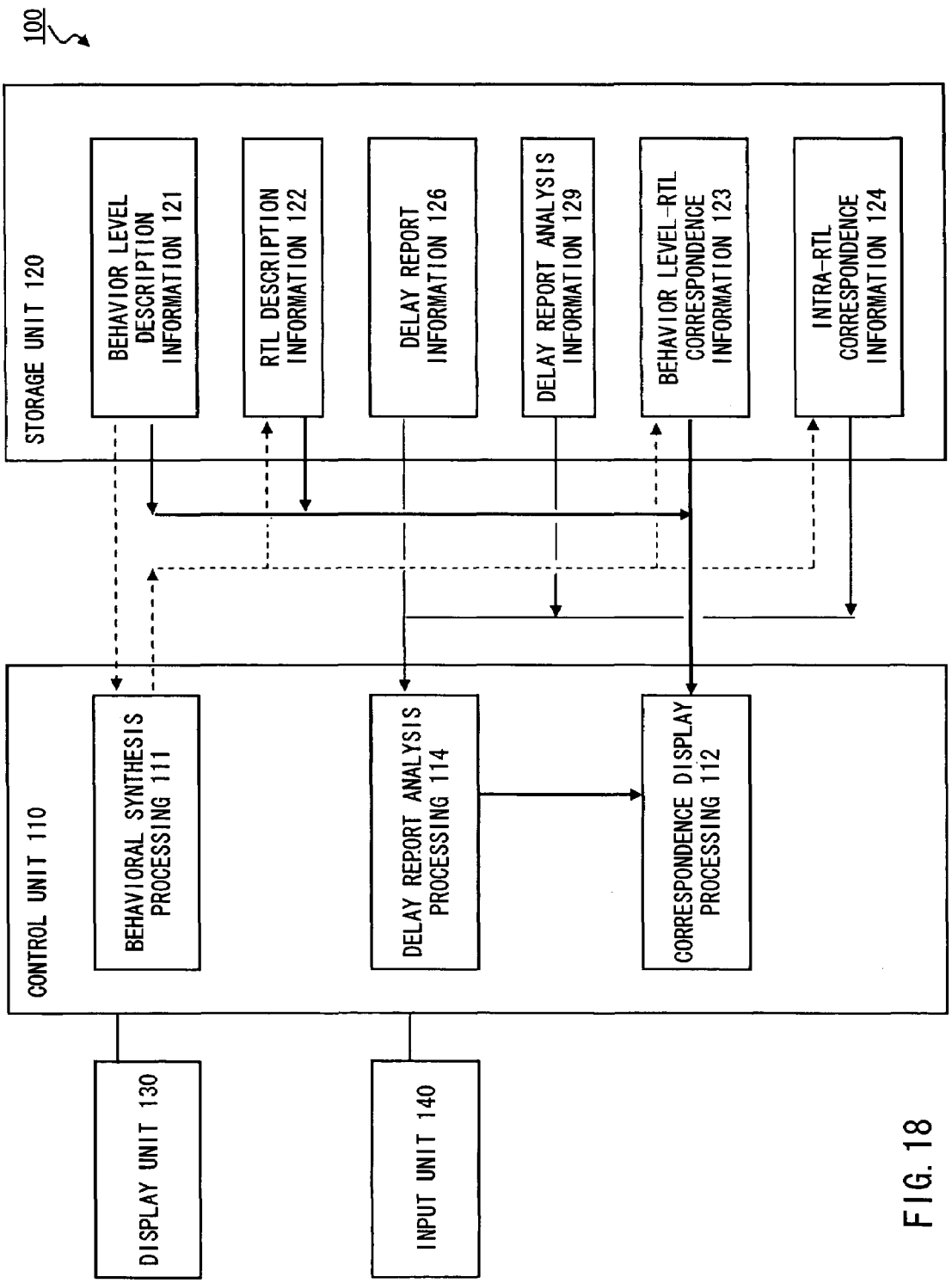
FIG. 18 is a functional block diagram depicting the circuit design support system according to the present invention.

Now the configuration of the circuit design support system according to Fourth Embodiment will be described with reference to the block diagram shown in FIG. 18. The circuit design support system according to the present embodiment executes the processing to correspond and display the behavior level description, RTL description and delay report generated by another system. This circuit design support system 100 comprises the delay report analysis processing 114 instead of the logical synthesis processing 113 in FIG. 8, in the control Unit 110, and comprises the delay report analysis information 129 instead of the gate-RTL correspondence information 125 in FIG. 8, in the storage unit 120.

The delay report analysis information 129 is the information on the rules for analyzing the text of the delay report information 126. The delay report analysis information 129 is input by the user and is stored in the storage unit 120. The data structure will be described later.

The delay report information 126 according to the present embodiment has the same information content as the delay report information in FIG. 8, but is acquired from a system (or a program) that is different from this system (or this program), and is input to the storage unit 120 by such means as a file copy. Therefore the stored format is different from the delay report information in FIG. 8. Here the delay report information 126 is a text format file, for example. The delay report information 126 is analyzed on the delay generated by such tools as STA (Statistic Timing Analysis), which is not shown in the drawing or by another system.

The delay report analysis processing 114, delay report information 126, delay report analysis information 129 and intra-RTL correspondence information 124 are input, the text of the delay report information 126 is analyzed based on the delay report analysis-information 129, and the analysis result is output to the correspondence display processing 112.

In the correspondence display processing 112 according to the present embodiment, the analysis result of the delay report analysis processing 114 is input in addition to the behavior level description information 121, the RTL description information 122, and the behavior level-RTL correspondence information 123, and the behavior level description, and RTL description and delay report are corresponded and displayed on the display unit 130. Detailed operation will be described later.

Now the data structure of the delay report analysis information 129 will be described with reference to FIG. 19. As FIG. 19 shows, the delay report analysis information 129 is comprised of the bus expansion rule, hierarchy separation rule, instance name renaming rule and target hierarchy rule.

"% s % d" in the bus expansion rule indicates that the instance name is separated into a character string and a decimal numeric, and the numeric value is regarded as a bit number of the bus. "/" and "$" of the hierarchy separation rule indicate that the hierarchy is the character string separated by "/" or "$".

"_reg" of the instance name renaming rule indicates that a character string, when this character string is deleted, has the possibility to be an instance, name of the RTL description. For the instance name renaming rule, a plurality of character strings may be listed. A normal expression rather than a character string may be used. "level 12" of the target hierarchy rule indicates that the hierarchy at the second level from the top and below can be the analysis target of the hierarchy.

In the correspondence display processing 112 according to the present embodiment, the behavior level description information 121, RTL description information 122 and delay report information 126 are corresponded and displayed, so the display screen of this processing is the same as FIG. 3 and FIG. 10.

In the present embodiment, the delay report display 1001 shown in FIG. 11 may be displayed, instead of the one in FIG. 10. Just like FIG. 10, FIG. 11A is an example of a display screen for displaying the delay report. FIG. 11B is a diagram depicting a path of the delay report in FIG. 11A. In this example, as FIG. 11A and FIG. 11B show, the hierarchy TOP is dispersed at the higher level of the hierarchy "INST_2" in a path of the delay report, and "$" in addition to "/" are used as the separators of the hierarchy in the delay report.

The processing of the correspondence display processing 112 is the same as the flow chart shown in FIG. 12. The flow chart of the delay report display processing S1204 is the same as FIG. 13, but the delay report information 126 is in text format, so in the processing in S1301, the delay report in text format is displayed as is. Now the user input processing (S1205) in this processing will be described with reference to the flow chart shown in FIG. 20. Just like the processing shown in FIG. 14, this processing is executed by the control unit 110 using the program of the correspondence display processing 112.

Figure 14:
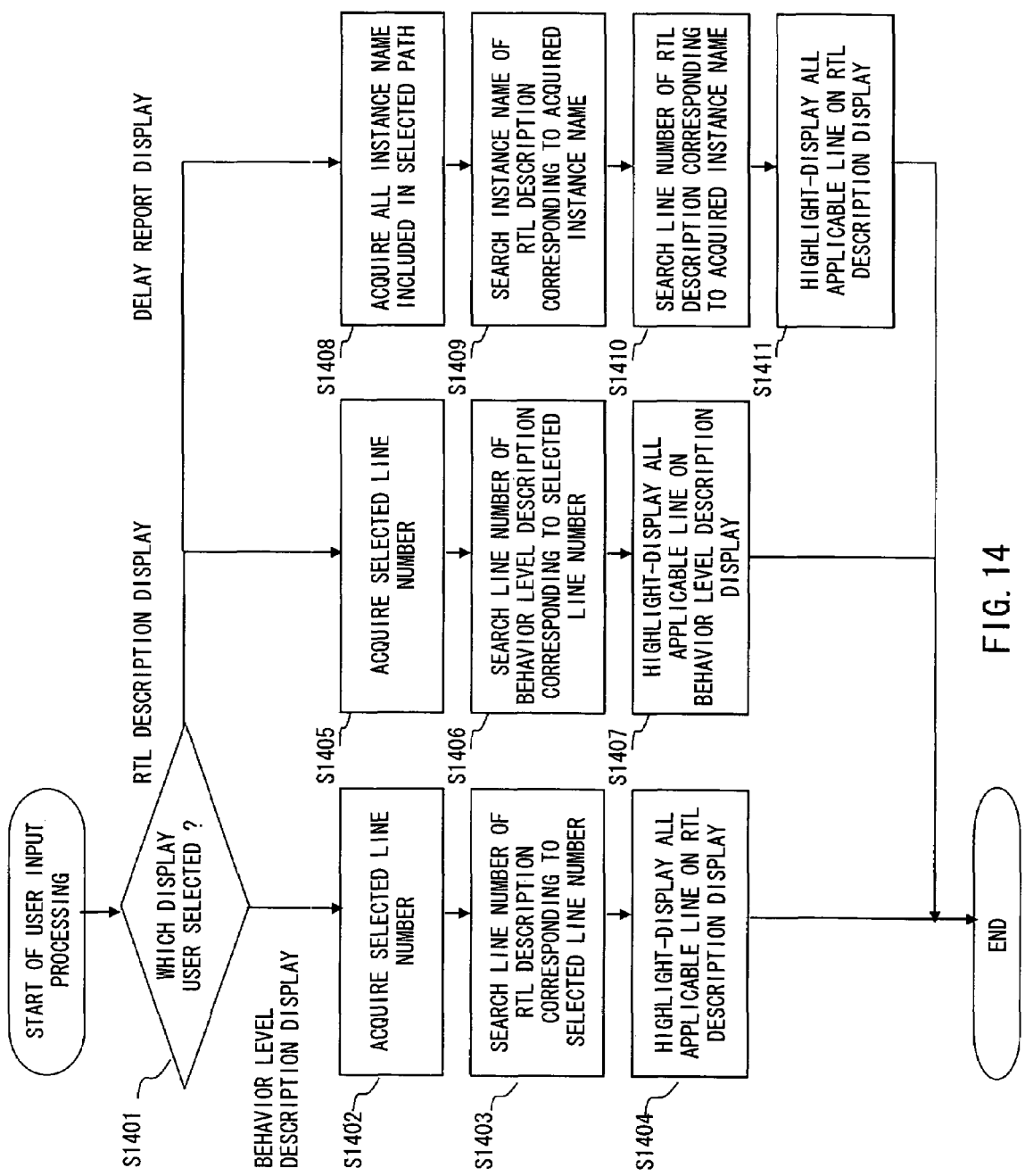
FIG. 14 is a flow chart depicting the operation of the user input processing according to the present invention.

S2001 to S2007 are the same as S1401 to S1407 in FIG. 14 for which description is omitted. S2008 is the same as S1408 in FIG. 14 and S2011 is the same as S1411 in FIG. 14, for which description is omitted unless it is necessary. In FIG. 14, the instance name of the gate acquired in S1408 is converted into the instance name of the RTL description using the gate-RTL correspondence information 125 in S1409, but in FIG. 20, these two processings are executed together in S2009.

If the delay report display is selected in S2001, the selected path in the delay report is analyzed using the delay report analysis information 129, and the instance name of the RTL is estimated (S2009). From the path selected by this processing, all the candidates of the instance names of RTL can be listed. Details of this processing will be described later.

Then the line numbers of the RTL description corresponding to the acquired candidates of the instance names are searched (S2010). In S2010, out of the candidates of the instance names of the RTL, one matching the instance name of a component of the RTL description in the intra-RTL correspondence information 124 is detected, and the line number of the RTL description of the matched instance is transferred to S2011. Then all the applicable lines on the RTL description display are highlight-displayed (S2011).

Figure 20:
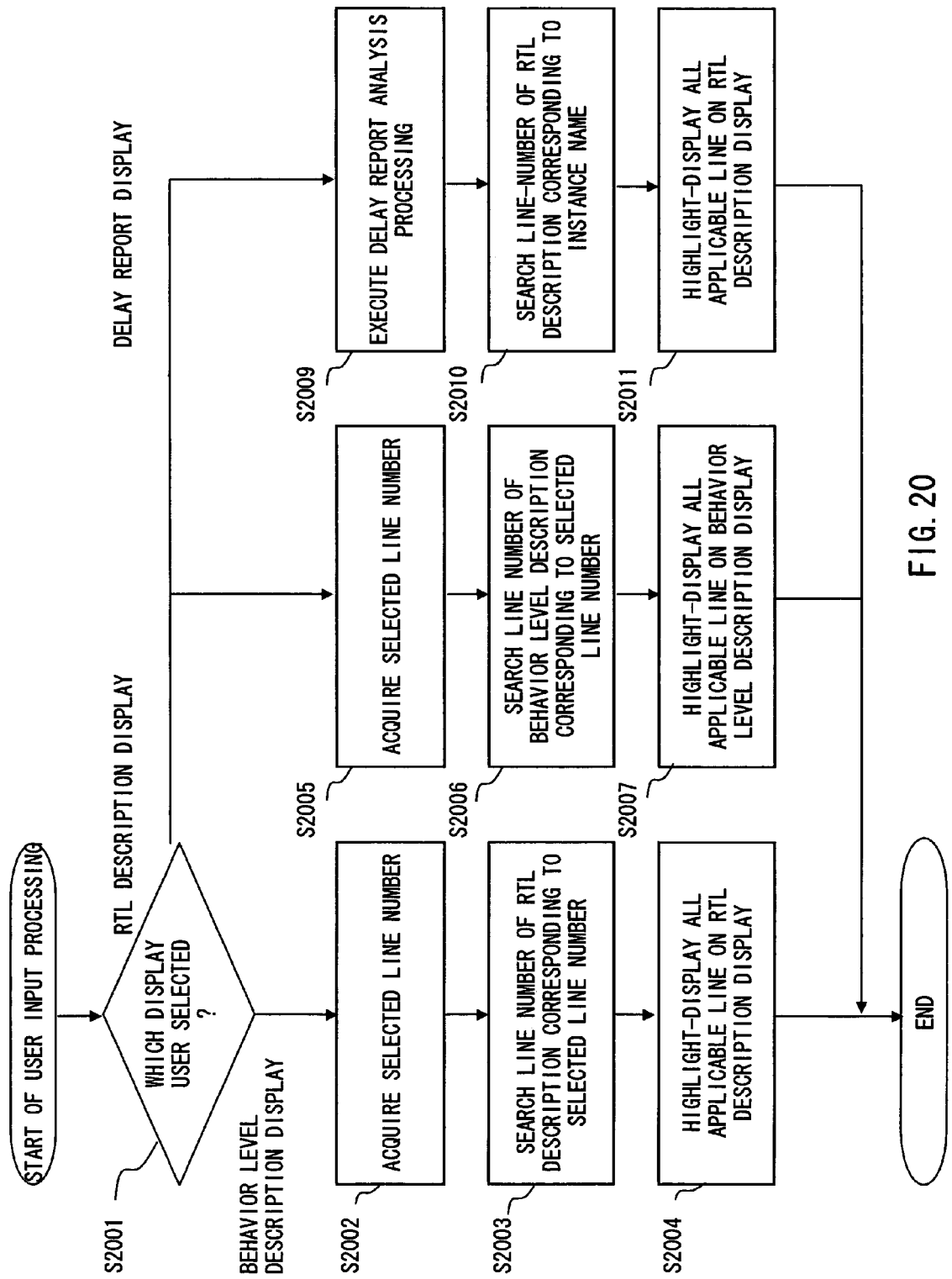
FIG. 20 is a flow chart depicting the operation of the user input processing according to the present invention.
Figure 21:
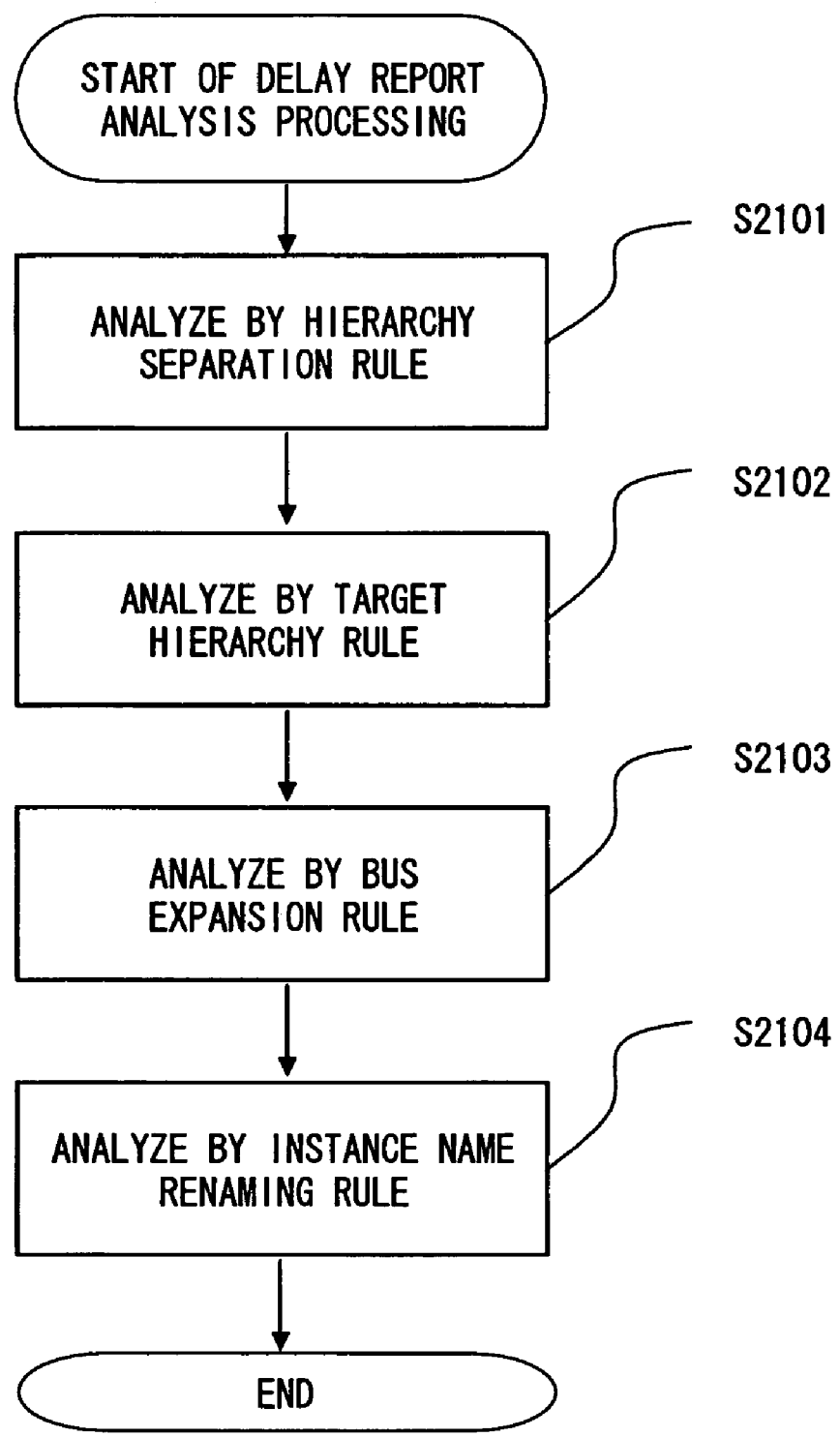
FIG. 21 is a flow chart depicting the operation of the delay report analysis processing according to the present invention.

Now the delay report analysis processing (S2009) in FIG. 20 will be described using the flow chart shown in FIG. 21. This processing is the processing of the delay report analysis processing 114 in FIG. 22, and just like the processing in FIG. 20, this processing is executed by the control unit 110 using the program of the correspondence display processing 112. In the description below, it is assumed that the delay report information 126 is a delay report shown in FIG. 11, and the delay report analysis information 129 is information shown in FIG. 19.

First the selected path is analyzed by the hierarchy separation rule (S2101). According to the hierarchy separation rule of the delay report analysis information 129, each line of the delay report information 126 is separated, and the separated character strings are regarded as hierarchies. In this case, the hierarchy separation rule is "/, $", so "INST_2" and "INST_4" in FIG. 11 are analyzed as hierarchies.

The second hierarchy from the bottom is recognized as an instance of the gate, and the hierarchy at the very bottom is recognized as a terminal of the instance. For example, in the case of "TOP/INST_2$RG_28_reg1$H02", "RG_28_reg1" is recognized as an instance directly under the hierarchy "INST_2", and "H02" is recognized as a terminal of "RG_28_reg1".

Then according to the target hierarchy rule, the selected path is analyzed (S2102). The hierarchy of the target hierarchy rule and below is the analysis target. In this case, the target hierarchy rule is "level 2", so when the character string at the highest hierarchy is deleted, only the two hierarchies or more which remain under that become the target. In the case of FIG. 11, the subsequent analysis target is one that is two hierarchies or more in the hierarchy "INST_2" or below.

Then according to the path expansion rule, the partial path which became the analysis target in S2102 is analyzed, and the original (in the RTL description) instance name is estimated (S2103). First out of the partial paths which remain as the analysis target in S2102, a character string recognized as an instance name in S2101 is acquired, and this character string is separated into the instance name and the bit position. In this case, the bus expansion rule is "% s % d", so the character string and the decimal number are separated, and the last character of the character string is regarded as the bit number of the bus, and the rest of the character string is the instance name. For example, in the case of the character string "RG_28_reg1", the instance name is "RG_28_reg", and the bit position is 1 in the analysis result.

The analysis result may not be uniquely determined in same cases. For example, "RG_28_reg31" can be estimated either that the instance name is "RG_28_reg3" and the bit position is "1", or the instance name is "RG_28_reg" and the bit position is "31". It is also possible that the instance does not have a bit width, and in this case the instance name is "RG_28_reg31". These candidates are all listed, and estimation continues using the instance name renaming rule next.

Now the candidates of the instance names are analyzed according to the instance name renaming rule, and the original (in the RTL description) instance name is estimated (S2104). Candidates where the character string of the instance name renaming rule is deleted from the character string are newly created. In this case, the instance name renaming rule is "_reg", so a character string when this character string is deleted from the instance name is added to the candidates. For example, from the instance name "RG_28_reg", the instance name "RG_28" is created and added to the candidates.

In S2010, among the candidates acquired thus far using the intra-RTL correspondence information, only those that exist as an instance name of the RTL description are selected. For example, the candidates acquired from path1 in FIG. 11 are "RG_28_reg1", "RG_28_reg", "RG_28", "INST_5", "INST_", "add_2353", "add_235", "add_23", "add_2", "add_", "U1_", "U1_", "U1_31", "U1_3", "INST_4", "add_2344", "add_234", "U1_2", "U18008", "U1800", "U180", "U18", "U1", "U16304", "U1630", "U163", "U16", "U17504", "U1750", "U$_{175}$", "U17", "RG_28_reg31" and "RG_28_reg3". Out of these candidates, "REG_28", "INST_5", "INST_4", etc. match with the instance names of the RTL description in the intra-RTL correspondence information 124 in FIG. 9A. At the same time, the file name of the RTL description and the line number of the RTL description for these instances can be acquired from the intra-RTL correspondence information 124.

As a result, information equivalent to the gate-RTL correspondence information can be acquired from the delay report analysis processing 114, and is transferred to the correspondence display processing 112.

By this method, the RTL description and the delay report corresponding to the behavior level description can be displayed according to the selection by the user, and the behavior level description and the delay report corresponding to the RTL description can be displayed, and the behavior level description and the RTL description corresponding to the delay report can be displayed. In embodiments other than the present embodiments, if a delay rule violation is detected first in the delay analysis after layout design (e.g. violation did not occur in logical analysis but delays became longer when wiring is considered), there is no means of displaying the RTL description corresponding to the path which violated the delay rule, and the behavior level description corresponding to the path which violated the delay rule cannot be displayed. In the present embodiment, a delay report in text format is analyzed, so the behavior level description and the RTL description can be corresponded and displayed not only for the delay report by logical synthesis but also for the delay report by STA after layout.

The processing of the delay report analysis processing S2009 shown in the above example is the case when the delay report analysis information has a bus expansion rule, hierarchy separation rule, instance name renaming rule and target hierarchy rule, but one or more of these rules may not be available. In this case, processing using these rules is omitted, and the candidates are listed based on other rules. Rules other than the bus expansion rule, hierarchy separation rule, instance name renaming rule and target hierarchy rule may be available. In this case, processing corresponding to these rules is newly added, and the candidates are listed based on these rules.

Fifth Embodiment

Figure 22:
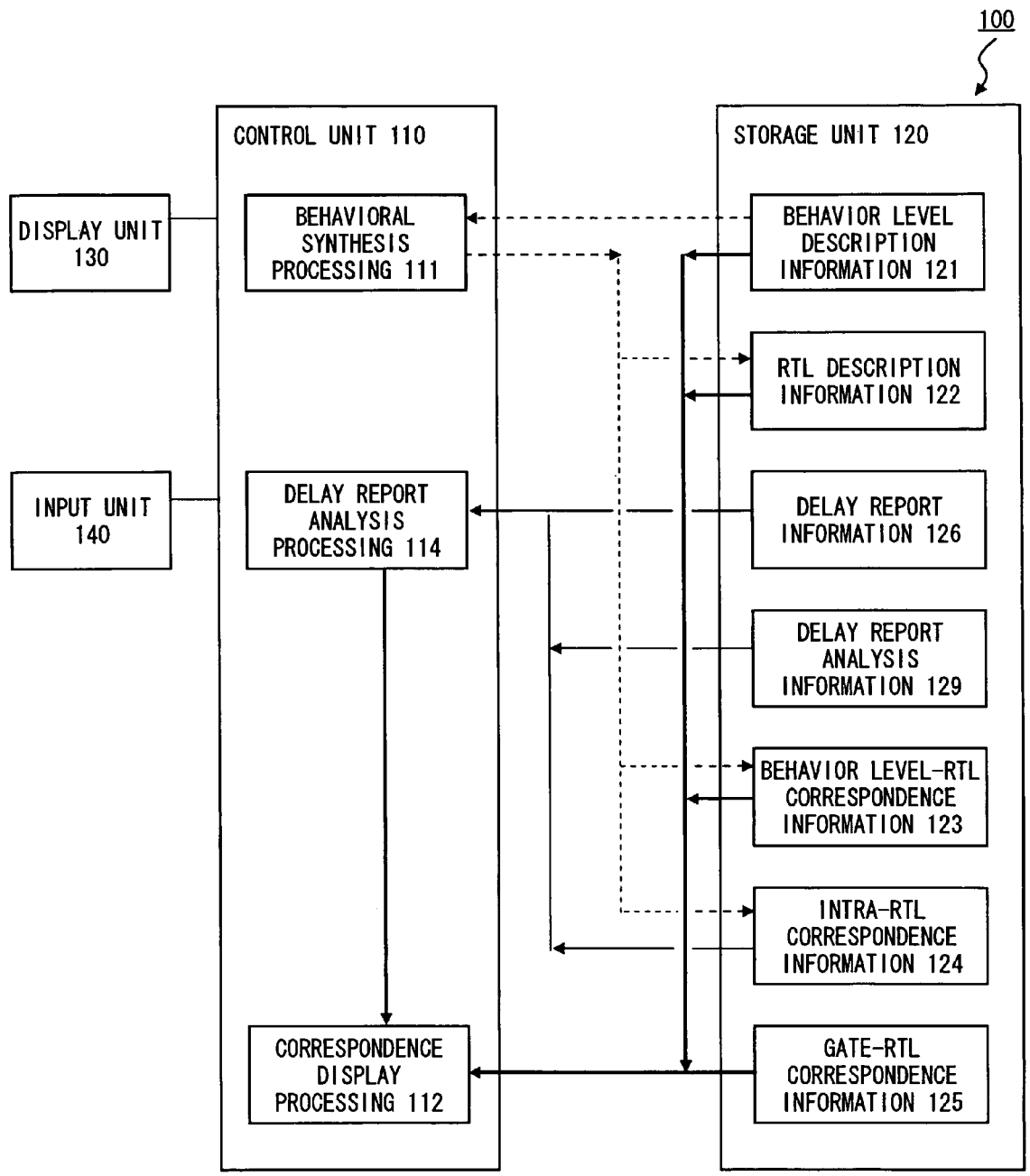
FIG. 22 is a functional block diagram depicting the circuit design support system according to the present invention.

Now the configuration of the circuit design support system according to Fifth Embodiment will be described with reference to the block diagram shown in FIG. 22. The circuit design support system according to the present embodiment executes processing to correspond and display the behavior level description, RTL description and delay report using the rule desired by the user. This circuit design support-system 100 comprises the gate-RTL correspondence information 125 in the storage unit 120, in addition to the configuration in FIG. 18.

For the gate-RTL correspondence information 125 according to the present invention, the content of the information is the same as FIG. 8, however it is not generated by logical synthesis processing, but is input by the user.

Other screen displays and processings are the same as Fourth Embodiment. The gate-RTL correspondence information 125 may be created by disposing the logical synthesis processing in the control unit 110.

According to this method, even if the delay report information is in text format and the instance names of the components of the RTL do not simply correspond to the instance names of the gates of the delay report, the RTL description and the delay report corresponding to the behavior level description can be displayed according to the selection by the user, and the behavior level description and the delay report corresponding to the RTL description can be displayed, and the behavior level description and the RTL description corresponding to the delay report can be easily displayed. Therefore from the delay report acquired by various logical synthesis tools and layout design tools, a desired path can be selected and displayed in correspondence with the behavior level and the RTL description.

Other Embodiments

In the above example, the delay report is input for the correspondence display processing, but the gate net list, which is the output of logical synthesis, may be input for the correspondence display processing 112. By this, the behavior level description, RTL description and gate net list can be corresponded and displayed.

In the above example, the behavior level is described in C language, but the present invention is not dependent on the language of the behavior level description. In other words, instead of C language, C++, System C, Spec C, ANSI-C, and a derivative language thereof, or system Verilog, for example, may be used. The effectiveness of the present invention does not change even if such a language as Verilog or VHDL, used for RTL description, is used for the behavior level description.

Figure 23:
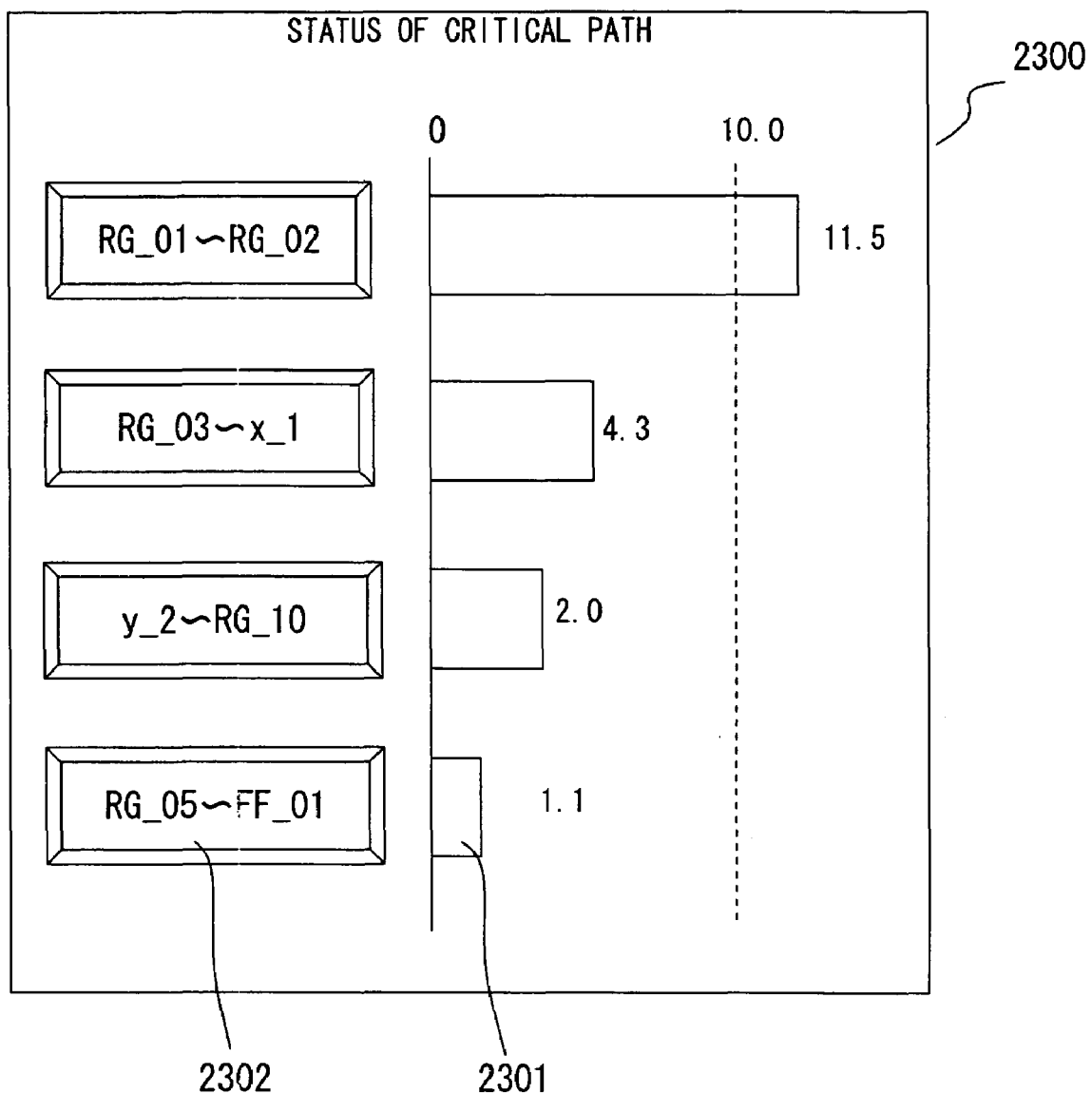
FIG. 23 is a diagram depicting a screen display example in the display processing according to the present invention.

When the above correspondence display processing 112 is started up, the static display screen shown in FIG. 23 may be displayed. In this display screen 2300, the delay time is indicated by the bar graph 2301 for each path of the delay report. This can clarify a path which violates the delay rule. The portion indicating the route of the path is the button 2302, and the display screen 300 of the above mentioned correspondence display may be displayed by clicking this button 2302.

Figure 24:
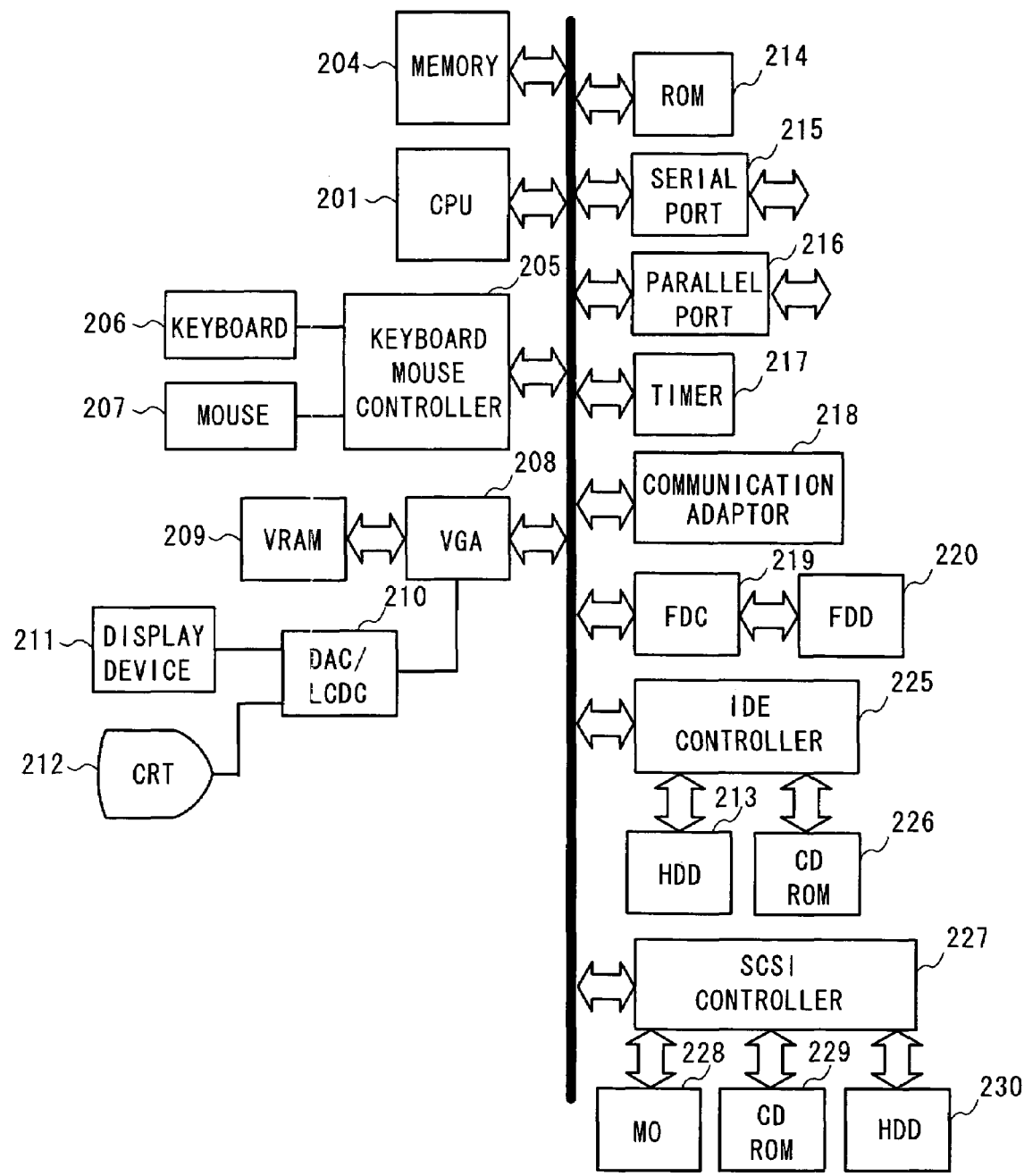
FIG. 24 is a hardware block diagram depicting the circuit design support system according to the present invention.
Figure 25:
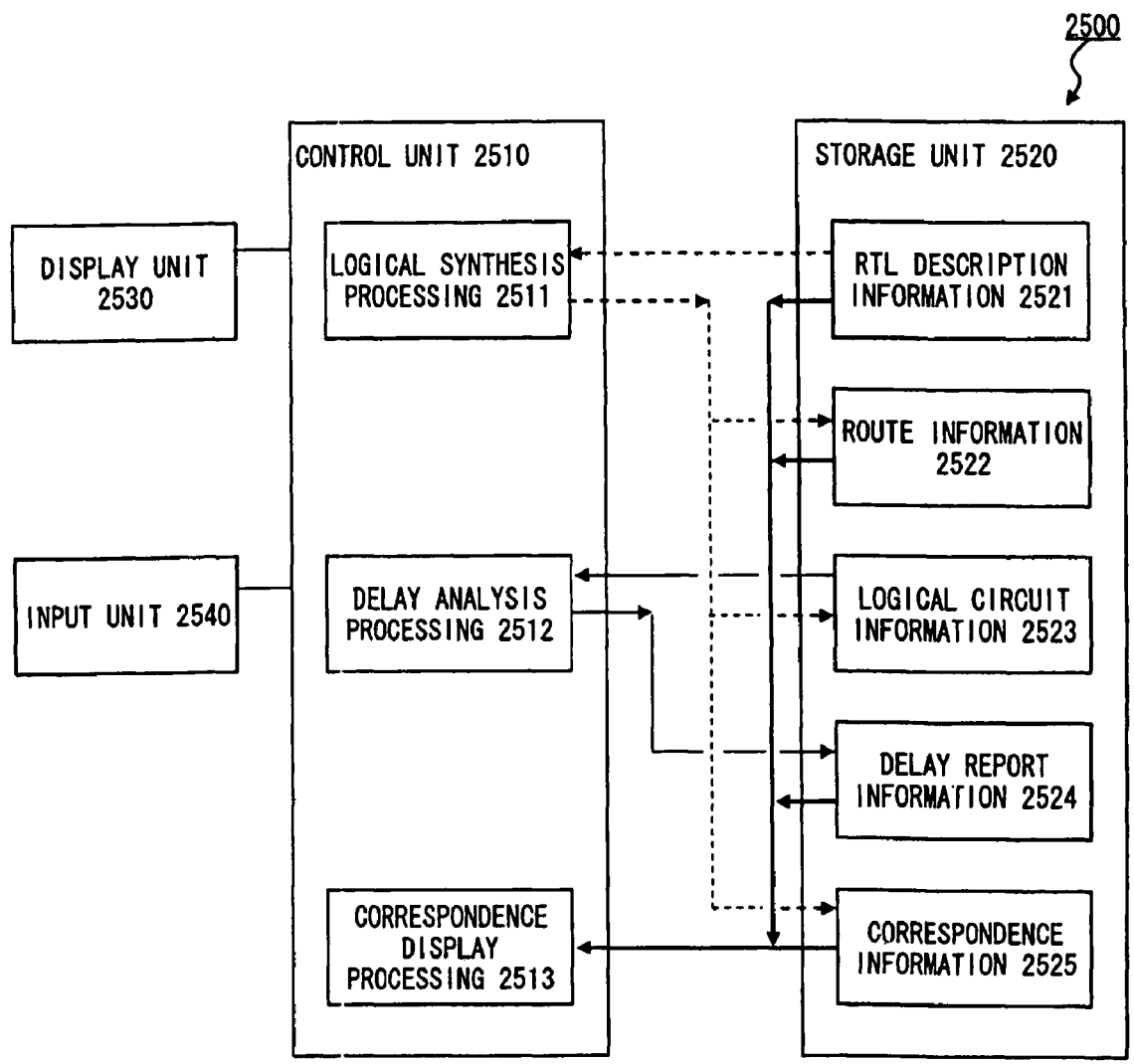
FIG. 25 is a functional block diagram depicting a conventional circuit design support system.

FIG. 24 shows an example of the hardware configuration for implementing the above circuit design support system 100. For the circuit design support system 100, a standard computer system can be used, comprising a central processing unit (CPU) 201 and a memory 204.

The CPU 201 and the memory 204 are connected to the hard disk device 213, which is an auxiliary storage device, via the bus. The flexible disk device 220, hard disk devices 213 and 230, and a storage medium drive such as a CD-ROM drives 226 and 229, and an MO drive 228 are connected to the bus via various controllers, such as the flexible disk controller 219, IDE controller 225 and SCSI controller 227. In the storage medium drive of the flexible disk device 220, a portable storage medium, such as a flexible disk, is inserted.

In the storage medium, computer programs for sending instructions to the CPU 201, and executing the functions of the circuit design support system 100, along with the operating system, can be stored. Computer programs are executed by being loaded into the memory 204. Computer programs can be compressed or divided into a plurality of parts when stored in the storage medium. The standard hardware configuration comprises user interface hardware.

The user interface hardware includes a pointing device (e.g. mouse 207, joy stick) and a keyboard 206 for input, or a display device 211, such as a liquid crystal display, and a CRT display 212 for displaying visual data to the user.

A printer can be connected via the parallel port 216. This computer system can connect a modem via the serial port 215, and is connected to a network via the serial port 215, modem or token ring or communication adaptor 218, to communicate with other computer systems. The above configuration can be omitted according to necessity.

As described above, according to the present invention, operation to check/correct the path, of which a delay rule violation is detected, description can be performed quickly and easily in the original behavior level for circuits designed using behavioral synthesis, by using the report after logical synthesis and the STA report after layout. Also when a circuit is designed using behavioral synthesis, it is possible to check what type of RTL description will be the description at a specific location of the behavior level description. It is also possible to check what kind of behavior level description becomes what kind of RTL description.

It is apparent that the present invention is not limited to the above embodiment that may be modified and changed without departing from the scope and spirit of the invention.

What is claimed is:

1. A computer program product, in a computer readable medium, including computer program instructions thereon which when executed by a computer to display information on a circuit information described according to each design level in circuit design, the computer program instructions implementing a method comprising:
    acquiring behavior level description information in which circuit information is described by description of a behavior level;
    acquiring lower level description information in which circuit information on a same circuit as the behavior level description information is described in a design level lower than the behavior level;
    acquiring correspondence information for making correspondence between a part of the behavior level description information and a part of the lower level description information; and
    displaying the correspondence between the part of the behavior level description information and the part of the lower level description information based on the correspondence information,
    wherein the displaying of the correspondence comprises:
    receiving a user selection of a part of the lower level description information:
    searching the correspondence information based on the selected part and determining a part of the behavior level description information corresponding to the selected part; and
    highlighting the determined part.

2. The computer program product according to claim 1, wherein the displaying of the correspondence comprises:
    receiving a user selection of a part of the behavior level description information;
    searching the correspondence information based on the selected part and determining a part of the lower level description information corresponding to the selected part; and
    highlighting the determined part.

3. The computer program product according to claim 1, wherein the displaying of the correspondence comprises:
    searching the correspondence information and determining a plurality of parts of the behavior level description information in which the corresponding parts of the lower level description information exist;
    highlighting the plurality of parts and prompting a user to select a part out of the plurality of parts;
    searching the correspondence information based on the selected part and determining a part of the lower level description information corresponding to the selected part; and
    highlighting the determined part of the lower level description information.

4. The computer program product according to claim 1, wherein the displaying of the correspondence comprises:
    searching the correspondence information and determining a plurality of parts of the lower level description information in which the corresponding parts of the behavior level description information exist;
    highlighting the plurality of parts and prompting a user to select a part out of the plurality of parts;

searching the correspondence information based on the selected part and determining a part of the behavior level description information corresponding to the selected part; and highlighting the determined part of the behavior level description information.

5. The computer program product according to claim 1, wherein the lower level description information is information on a circuit described in Register Transfer Level (RTL).

6. The computer program product according to claim 1, wherein the lower level description information is delay information of a gate in a gate level.

7. The computer program product according to claim 1, wherein the lower level description information is a gate net list in a gate level.

8. The computer program product according to claim 1, wherein the lower level description information is delay information of a gate in layout design.

9. The computer program product according to claim 1, wherein the lower level description information includes RTL circuit information described by Register Transfer Level (RTL) and delay information of a gate in gate level.

10. The computer program product according to claim 1, wherein the correspondence information is information for making correspondence between a line of the behavior level description information and a line of the lower level description information.

11. The computer program product according to claim 6, wherein the correspondence information is information for making correspondence between a line of the behavior level description information and a gate of the delay information.

12. The computer program product according to claim 8, wherein the correspondence information is information for making correspondence between a line of the behavior level description information and a gate of the delay information.

13. The computer program product according to claim 9, wherein the correspondence information includes information for making correspondence between a line of the behavior level description information and a line of the RTL circuit information, and information for making correspondence between a line of the RTL circuit information, and gate of the delay information.

14. The computer program product according to claim 1, wherein the lower-level description information and the correspondence information are generated based on the behavior level description information.

15. A circuit design support method for displaying information on a circuit information described according to each design level in circuit design, comprising:

acquiring behavior level description information in which circuit information is described by description of a behavior level;

acquiring lower level description information in which circuit information on a same circuit as the behavior level description information is described in a design level lower than the behavior level;

acquiring correspondence information for making correspondence between a part of the behavior level description information and a part of the lower level description information; and displaying the correspondence between the part of the behavior level description information and the part of the lower level description information based on the correspondence information, wherein displaying the correspondence further comprises:

receiving a user selection of a part of the correspondence information; and highlighting the user selection, including highlighting both the behavior level description information and the lower level description information selected from the correspondence information.

16. The circuit design support method according to claim 15, wherein the lower level description information and the correspondence information are generated based on the behavior level description information.

17. A circuit design support system for displaying information on a circuit information described according to each design level in circuit design, comprising:

a behavior level description information acquisition unit for acquiring behavior level description information in which circuit information is described by description of a behavior level;

a lower level description information acquisition unit for acquiring lower level description information in which circuit information on a same circuit as the behavior level description information is described in a design level lower than the behavior level;

a correspondence information acquisition unit for acquiring correspondence information for making correspondence between a part of the behavior level description information and a part of the lower level description information; and a display unit for displaying the correspondence between the part of the behavior level description information and the part of the lower level description information based on the correspondence information, wherein the display unit comprises:

a selection unit for receiving a user selection of a part of the correspondence information; and a highlighting unit for highlighting the user selection, including highlighting both the behavior level description information and the lower level description information selected from the correspondence information.

18. The circuit design support system according to claim 17, further comprising a synthesis unit for generating the lower level description information and the correspondence information based on the behavior level description information.

* * * * *

UNITED STATES PATENT AND TRADEMARK OFFICE
CERTIFICATE OF CORRECTION

| | | |
|---|---|---|
| PATENT NO. | : 7,370,297 B2 | Page 1 of 1 |
| APPLICATION NO. | : 11/065535 | |
| DATED | : May 6, 2008 | |
| INVENTOR(S) | : Otsubo | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 430 days.

Signed and Sealed this
Fourth Day of January, 2011

David J. Kappos
*Director of the United States Patent and Trademark Office*